United States Patent
Matsunaga et al.

(10) Patent No.: US 6,936,336 B2
(45) Date of Patent: Aug. 30, 2005

(54) TRANSFER SHEET AND PRODUCTION METHOD OF THE SAME AND WIRING BOARD AND PRODUCTION METHOD OF THE SAME

(75) Inventors: Takahiro Matsunaga, Kokubu (JP); Katsura Hayashi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/389,135

(22) Filed: Mar. 14, 2003

(65) Prior Publication Data

US 2003/0178227 A1 Sep. 25, 2003

(30) Foreign Application Priority Data

Mar. 15, 2002 (JP) .................................. P2002-072920
Apr. 15, 2002 (JP) .................................. P2002-111982
May 24, 2002 (JP) .................................. P2002-151318
Jun. 17, 2002 (JP) .................................. P2002-176314

(51) Int. Cl.⁷ .............................. H05K 1/00; B32B 3/00
(52) U.S. Cl. ...................... 428/209; 428/192; 428/344; 174/250; 174/258
(58) Field of Search ............................... 428/209, 629

(56) References Cited

U.S. PATENT DOCUMENTS 4,421,827 A * 12/1983 Phillips ...................... 428/418
4,762,747 A * 8/1988 Liu et al. .................... 428/343
5,725,706 A * 3/1998 Thoma et al. ............... 156/150
6,346,335 B1 * 2/2002 Chen et al. .................. 428/629

FOREIGN PATENT DOCUMENTS

| JP | 10-051108 | 2/1998 |
| JP | 11-121898 | 4/1999 |
| JP | 11-354909 | 12/1999 |
| JP | 2001-068813 | 3/2001 |
| JP | 3245988 | 11/2001 |

* cited by examiner

*Primary Examiner*—Cathy F. Lam
(74) *Attorney, Agent, or Firm*—Hogan & Hartson LLP

(57) ABSTRACT

A transfer sheet for use in forming a conductor circuit comprises a base and a metal layer formed into a circuit pattern on the base. The metal layer is transferred onto a surface of an insulation layer. At least part of the circuit pattern of the metal layer is formed by laser-processing. Since it is possible, without using an etching process and a plating process at a minute part of the conductor circuit, to remove the metal layer by emitting laser light having a minute beam diameter, it is possible to form a minute conductor circuit which is 50 μm or less in width and pitch, with the result that it is prevented that the conductor circuit has a break because of excessive etching and a failure of plating deposition or the conductor circuit is short-circuited because of the residue of etching and a short of plating.

6 Claims, 13 Drawing Sheets

TRANSFER SHEET AND PRODUCTION METHOD OF THE SAME AND WIRING BOARD AND PRODUCTION METHOD OF THE SAME

BACKGROUND OF THE INVENTION

1. Field of the Invention

The present invention relates to a transfer sheet for forming a conductor circuit of a wiring board used for a multilayer wiring board, a semiconductor device housing package and the like, a production method of the same, a wiring board produced by the use of the transfer sheet, and a production method of the same.

2. Description of the Related Art

Traditionally, as a high-density wiring board, for example, as a high-density multilayer wiring board used for a package which houses a semiconductor device, a printed board made of an organic resin is heavily used. The printed board is produced by forming a conductor circuit by adhering copper foil onto the surface of an insulation layer made of an organic resin such as an epoxy resin and then etching the copper foil, or by forming a conductor circuit on the surface of an insulation layer by a plating method, and thereafter laminating the insulation layers so as to become multilayered.

However, in the case of forming a conductor circuit by adhering copper foil onto the surface of an insulation layer and then removing an unnecessary part of the copper foil by etching or forming a conductor circuit on the surface of an insulation layer by the plating method, an insulation layer is inevitably exposed to an agent such as an etching agent or a plating agent, and therefore, there is a problem that the characteristic of the insulation layer changes. Moreover, since a conductor circuit is merely put on the surface of an insulation layer, there is a problem of an adhesion failure of the conductor circuit onto the insulation layer, a gap in an interface between copper foil and the insulation layer, or the like. Furthermore, in the case of multilayering, there is a problem that the degree of flatness of an insulation layer is lowered by a convex portion formed by a conductor circuit.

In order to solve such problems, a method of producing a transfer sheet on which a conductor circuit is formed by adhering metal foil onto a base and then removing an unnecessary part of the metal foil by etching, or formed on a base by the plating method, and thereafter transferring the conductor circuit of the transfer sheet onto an insulation layer is proposed.

Such a method of transferring a conductor circuit has an advantage because it is excellent in point that since the conductor circuit is formed on a base by the etching method or the plating method and then the conductor circuit is transferred onto an insulation layer, the insulation layer is not exposed to various kinds of agents, and excellent in adhesion of the conductor circuit to the insulation layer because the conductor circuit is buried into the insulation layer by a pressure applied when the conductor circuit is transferred.

In recent years, a wiring board used for a multilayered wiring board, a semiconductor device housing package and the like has become more high-density, and such a minute conductor circuit that has a width and pitch of 50 μm or less is required.

In the case of forming a minute conductor circuit on a transfer sheet by the conventional method using the etching method or the plating method as described above, there is a large difference of a speed of developing a resist layer used in an etching process or a plating process between a minute part of 50 μm or less and a rough part of more than 50 μm, and therefore, a desired resist pattern cannot be formed, or the adhesion force of a resist layer of the minute part decreases and the resist layer peels off in the etching process or the plating process. Furthermore, since it is considerably difficult to control an etching speed and a plating deposition speed at the minute part, excessive etching or a failure of plating deposition occurs. As a result, there is a problem that the conductor circuit has a break or the conductor layer is short-circuited because of the residue of etching or a short of plating, and it is difficult to form a minute conductor circuit whose width and pitch are 50 μm or less.

Further, the size of a base of a transfer sheet is apt to be changed because of an etching fluid or a plating fluid, and particularly at a minute part, the accuracy of position is lowered by changes in size of a base at a pattern part and a non-pattern part, so that there is a problem that a short or a break of a conductor circuit is caused when a conductor circuit is transferred onto an insulation layer.

Still further, traditionally, as a wiring board, for example, as an electronic component module wiring board on which a passive component and an active component are mounted and which constitutes part of an electronic circuit, a printed board made of an organic resin insulation layer or a ceramic board made of ceramics is heavily used. There is a case where, in such a printed board or a ceramic board, a resistor is formed in part of a wiring circuit formed on an insulation layer.

A method of forming the resistor is, for example, a thin film forming method of forming a resistor layer previously formed on an insulation layer by spattering, plating or the like into a resistor having a desired shape and a desired resistance value by the use of a photolithography method, a printing method of printing resistor paste on an insulation layer and forming a resistor having a desired shape and a desired resistance value, or the like.

However, the printing method has a problem that it is difficult to print resistor paste by an even thickness, a blur is apt to be made at the time of printing, and therefore, the accuracy of a resistance value is lowered by variations in thickness, width and length of a resistor.

Further, the method of using photolithography has a problem that although the shape of a resistor is relatively stable as compared with in the printing method, it is difficult to form a resistor layer by an even thickness at the time of forming the resistor layer by spattering, plating or the like, and the accuracy of a resistance value is low as well.

In order to solve such problems, a method of forming a resistor on an insulation layer and then trimming by laser light so as to have a desired resistance value while measuring a resistance value to obtain a highly accurate resistor is proposed.

However, the method of trimming by laser light as described above has a problem that it is considerably difficult to accurately remove only a resistor by laser light, the laser light reaches an insulation layer of a ground and damages the insulation layer, and consequently, an insulation failure is caused in a wiring board.

SUMMARY OF THE INVENTION

The present invention was made in consideration of these problems in the prior arts, and an object thereof is to provide a transfer sheet having a minute conductor circuit which is 50 μm or less in width and pitch, and a wiring board using the same.

Another object of the invention is to provide a transfer sheet for forming a minute conductor circuit which is 50 μm or less in width and pitch and excellent in the accuracy of position, a production method of the same, a wiring board, and a production method of the same.

Still another object of the invention is to provide a transfer sheet for forming a resistor which is excellent in the accuracy of a resistance value without damaging an insulation layer, a production method of the same, a wiring board, and a production method of the same.

Still another object of the invention is to provide a transfer sheet for forming a minute conductor circuit which is excellent in high-frequency transmission characteristic and excellent in the accuracy of position, and a wiring board using the same.

The invention provides a transfer sheet for use in forming a conductor circuit, comprising a base, and a metal layer formed into a circuit pattern on the base, the metal layer being transferred onto a surface of an insulation layer, wherein at least part of the circuit pattern of the metal layer is formed by laser-processing.

According to the invention, since at least part of the circuit pattern of the metal layer is formed by laser-processing, it is possible, without using an etching process or a plating process in which it is considerably difficult to control an etching speed or a plating deposition speed, to remove the metal layer by emitting laser light having a minute beam diameter. Therefore, it is possible to form a minute conductor circuit having 50 μm or less in width and pitch, and consequently, it is prevented that a conductor circuit has a break because of excessive etching or a failure of plating deposition or a conductor circuit is short-circuited because of the residue of etching and a short of plating.

In the invention, it is preferable that a rim of the circuit pattern part of the metal layer formed by laser-processing protrudes to the opposite side to the base.

According to the invention, since the rim of the circuit pattern part of the metal layer formed by laser-processing is made to protrude to the opposite side to the base, the protrusion part of the metal layer is buried and fixed into the insulation layer when the metal layer of the transfer sheet is transferred onto the insulation layer. Therefore, it is possible to fortify the adhesion of the metal layer and the insulation layer, and consequently, it is possible to obtain a transfer sheet which is capable of stably transferring a minute conductor circuit onto an insulation layer without causing a transfer failure.

The invention provides a transfer sheet for use in forming a conductor circuit, comprising a base, and a metal layer on the base, the metal layer being transferred onto a surface of an insulation layer, wherein light-transmittance of the base in a wavelength of 150 to 400 nm is 0.6 or more.

According to the invention, since light-transmittance of the base in a wavelength of 150 to 400 nm is set to 0.6 or more, in the case of processing the metal layer into a circuit pattern by laser light having such a wavelength of 150 to 400 nm that is excellent in fine processing, the base makes most part of the laser light transmit without absorbing. Therefore, it is possible to form a minute circuit pattern having a width and pitch of 50 μm or less without damaging the base by the laser light, and consequently, it is possible to obtain a transfer sheet whose base keeps holding a metal layer of a minute circuit pattern with accuracy and which is excellent in the accuracy of position and appropriate for forming a metal layer of a minute circuit pattern.

In the invention, it is preferable that the metal layer is formed into a circuit pattern and at least part of the circuit pattern is formed by laser-processing.

Further, according to the invention, since at least part of the circuit pattern of the metal layer is formed by laser-processing, it is possible, without using an etching process or a plating process in which it is considerably difficult to control an etching speed or a plating speed, to remove the metal layer by emitting laser having a minute beam diameter. Therefore, it is possible to form a minute conductor circuit having a width and pitch of 50 μm or less, and consequently, it is prevented that a conductor circuit has a break because of excessive etching or a failure of plating deposition or a conductor circuit is short-circuited because of the residue of etching or a short of plating.

In the invention, it is preferable that a rim of the circuit pattern part of the metal layer formed by laser-processing protrudes to the opposite side to the base.

Further, according to the invention, since the rim of the circuit pattern part of the metal layer formed by laser-processing is made to protrude to the opposite side to the base, the protrusion part of the metal layer is buried and fixed into the insulation layer when the metal layer of the transfer sheet is transferred onto the insulation layer. Therefore, it is possible to fortify the adhesion of the metal layer and the insulation layer, and consequently, it is possible to obtain a transfer sheet which is capable of stably transferring of a minute conductor circuit onto an insulation layer without causing a transfer failure.

In the invention, it is preferable that the metal layer is a high-resistance metal layer of 20 μΩ·cm or more.

According to the transfer sheet of the invention, since the metal layer on the base is the high-resistance metal layer of 20 μΩ·cm or more, it is possible to process the high-resistance metal layer with accuracy by laser-processing so as to have a desired resistance value, and it is possible, without damaging an insulation layer by laser light, to form a resistor serving as a conductor circuit which has a highly accurate resistance value by transferring the high-resistance metal layer onto the insulation layer.

In the invention, it is preferable that a rim of the high-resistance metal layer formed by laser-processing protrudes to the opposite side to the base.

Furthermore, according to the invention, since the rim of the high-resistance metal layer formed by laser-processing is made to protrude to the opposite side to the base, it is possible to obtain a high anchor effect by burying and fixing the protrusion part into an insulation layer at the time of transferring the high-resistance metal layer of the transfer sheet onto the insulation layer. Therefore, it is possible to stably transfer the high-resistance metal layer onto the insulation layer without causing a transfer failure.

The invention provides a transfer sheet for use in forming a conductor circuit, comprising a base, and a metal layer formed into a circuit pattern on the base, the metal layer being transferred onto a surface of an insulation layer, wherein on an upper surface of the metal layer, an organic resin film whose light-transmittance in a wavelength of 150 to 400 nm is 0.4 or less is formed.

According to the invention, an organic resin film whose light-transmittance in a wavelength of 150 to 400 nm is 0.4 or less is formed on the upper surface of the metal layer, so that when laser light having a minute beam diameter is emitted from the side of the organic resin film, the organic resin film absorbs laser light in a favorable manner, whereby a part of the organic resin film irradiated with the laser light is efficiently dissolved and removed. A part of the organic resin film not irradiated with the laser light protects the metal layer, and thereby effectively prevents fusion deformation of the metal layer due to heat generated by the laser light, and a minute circuit pattern can be formed without impairing flatness of the surface of the metal layer. As a result, it is possible to form a minute conductor circuit which is excellent in high-frequency transmission characteristic.

In the invention, it is preferable that at least part of the circuit pattern of the metal layer is formed by laser-processing.

Further, according to the invention, since at least part of the circuit pattern of the metal layer is formed by laser-processing, it is possible, without using an etching process or a plating process in which it is considerably difficult to control an etching speed or a plating deposition speed, to remove the metal layer by emitting laser light having a minute beam diameter. Therefore, it is prevented that a conductor circuit has a break because of excessive etching or a failure of plating deposition or a conductor circuit is short-circuited because of the residue of etching or a short of plating.

The invention provides a production method of a transfer sheet comprising the steps of forming a metal layer on a base, and processing the metal layer into a circuit pattern by emitting laser from a side of the metal layer and removing at least part of the metal layer.

According to the invention, since the method comprises the steps of forming a metal layer on a base, and processing the metal layer into a circuit pattern by emitting laser from the side of this metal layer and removing at least part of the metal layer, it is possible, without using an etching process and a plating process using various kinds of agents in which fine processing is difficult and unstable when forming a minute conductor circuit part, to remove the metal layer by laser-processing in which reproducibility is favorable. Therefore, it is possible to easily and stably produce a transfer sheet which has a minute conductor circuit.

The invention provides a production method of a transfer sheet comprising the steps of forming a high-resistance metal layer on a base, and trimming the high-resistance metal layer so as to have a desired resistance value by emitting laser light from a side of the high-resistance metal layer and removing at least part of the high-resistance metal layer.

Further, according to the invention, since the method comprises the steps of forming a high-resistance metal layer on a base and trimming the high-resistance metal layer so as to have a desired resistance value by emitting laser light from the side of the high-resistance metal layer and removing at least part of the high-resistance metal layer, it is possible to form a resistor having a highly accurate resistance value by laser light which is excellent in fine processing, and it is prevented that the insulation layer is damaged by laser light.

The invention provides a production method of a transfer sheet comprising the steps of forming a metal layer on a base, forming an organic resin film whose light-transmittance in a wavelength of 150 to 400 nm is 0.4 or less on an upper surface of the metal layer, and processing the metal layer into a circuit pattern by emitting laser light having a wavelength in which light-transmittance is 0.4 or less from a side of the organic resin film and removing at least part of the organic resin film and the metal layer.

According to the production method of a transfer sheet of the invention, since the method comprises the steps of forming the metal layer on a base, forming the organic resin film whose light-transmittance in a wavelength of 150 to 400 nm is 0.4 or less on this metal layer, and processing the metal layer into a circuit pattern by emitting laser light having a wavelength in which light transmittance is 0.4 less from the side of the organic resin film and removing at least part of the organic resin film and the metal layer, it is possible, without using an etching process or a plating process using various kinds of agents in which fine processing is difficult and unstable when forming a minute conductor circuit part, to remove the metal layer by laser-processing in which reproducibility is favorable, and it is possible by the organic resin film on the metal layer to effectively prevent fusion deformation of the metal layer due to heat generated by laser light and ensure flatness of the surface of the metal layer. Therefore, it is possible to easily and stably produce a transfer sheet which has a minute conductor circuit and which is excellent in high-frequency transmission characteristic.

The invention provides a wiring board comprising:

an insulation layer; and a conductor circuit, the conductor circuit being formed by transferring, from a transfer sheet including a base and a metal layer formed into a circuit pattern on the base and in which at least part of the circuit pattern is formed by laser-processing, the metal layer onto a surface of the insulation layer.

The invention provides a wiring board comprising:

an insulation layer; and a conductor circuit, the conductor circuit being formed by transferring, from a transfer sheet including a base having light-transmittance in a wavelength of 150 to 400 nm of 0.6 or more and a metal layer formed into a circuit pattern on the base and in which at least part of the circuit pattern is formed by laser-processing, the metal layer onto a surface of the insulation layer.

According to the invention, the wiring board is constituted by forming the conductor circuit by transferring the metal layer of the transfer sheet onto the surface of the insulation layer, so that it is possible to obtain a wiring board which has a minute conductor circuit having a width and pitch of 50 µm or less.

The invention provides a wiring board comprising:

an insulation layer; and a resistor, the resistor being formed by transferring, from a transfer sheet including a base and a high-resistance metal layer of 20 µΩ·cm or more on the base and in which at least part of the high-resistance metal layer is formed by laser-processing, the high-resistance metal layer onto a surface of the insulation layer.

Furthermore, according to the invention, since the wiring board is constituted by transferring the high-resistance metal layer of the transfer sheet of the above construction to form a resistor on the surface of the insulation layer, it is possible to form a resistor having a highly accurate resistance value without damaging the insulation layer, and consequently, it is possible to obtain a wiring board which is excellent in insulation performance and accuracy of a resistance value.

The invention provides a wiring board comprising:

an insulation layer; and a conductor circuit, the conductor circuit being formed by transferring, from a transfer sheet including a base and a metal layer formed into a circuit pattern on a base and in which an organic resin film having light-transmittance in a wavelength of 150 to 400 nm of 0.4 or less on a surface of the metal layer, the metal layer onto a surface of the insulation layer.

According to the invention, since the wiring board is constituted by transferring a metal layer of a transfer sheet of the above construction to form a conductor circuit on the surface of the insulation layer, it is possible to obtain a wiring board having a minute conductor circuit which is excellent in high-frequency transmission characteristic.

In the invention, it is preferable that the insulation layer includes a liquid crystal polymer film, and organic resin adhesive layers which coat both surfaces of the liquid crystal polymer film opposed to each other.

According to the invention, since the insulation layer includes a liquid crystal polymer film and organic resin adhesive layers, it is possible to obtain favorable high-frequency transmission characteristic, and it is possible to form a minute through conductor which is 100 $\mu$m or less in diameter in a favorable manner.

The invention provides a production method of a wiring board comprising the steps of:

overlaying a metal-layer-side face of a transfer sheet including a base and a metal layer formed into a circuit pattern on the base and in which at least part of the circuit pattern of the metal layer is formed by laser-processing, on a surface of an insulation layer;

pressure-contacting the transfer sheet and the insulation layer; and removing the base of the transfer sheet to transfer the metal layer onto the insulation layer, whereby forming the conductor circuit.

According to the invention, since the method comprises the steps of overlaying the metal-layer-side face of the transfer sheet on the surface of the insulation layer, pressure-contacting the transfer sheet and the insulation layer, and removing the base of the transfer sheet to transfer the metal layer onto the insulation layer, whereby forming a conductor circuit, it is possible to easily form a minute conductor circuit having a width and pitch of 50 $\mu$m or less on an insulation layer, and since a conductor circuit is transferred onto an insulation layer, the insulation layer is not exposed to various kinds of agents. Therefore, the characteristic of the insulation layer is not lowered by the agents. Moreover, since the conductor circuit is buried into the insulation layer by a pressure applied when the conductor circuit is transferred, it is possible to obtain a wiring board which is excellent in adhesion of the conductor circuit to the insulation layer.

The invention provides a production method of a wiring board comprising the steps of:

overlaying a metal-layer-side face of a transfer sheet including a base having light-transmittance in a wavelength of 150 to 400 nm of 0.6 or more and a metal layer formed into a circuit pattern on the base and in which at least part of the circuit pattern is formed by laser-processing, on a surface of an insulation layer;

pressure-contacting the transfer sheet and the insulation layer; and removing the base of the transfer sheet to transfer the metal layer onto the insulation layer, whereby forming the conductor circuit.

According to the invention, since the method comprises the steps of overlaying a metal-layer-side face of the above transfer sheet on the surface of an insulation layer, pressure-contacting the transfer sheet and the insulation layer, and removing the base of the transfer sheet to transfer the metal layer onto the insulation layer, whereby forming the conductor circuit, it is possible to easily form a minute conductor circuit having a width and pitch of 50 $\mu$m or less on the insulation layer, and since the conductor circuit is trans-ferred onto the insulation layer, the insulation layer is not exposed to various kinds of agents. Therefore, the characteristic of the insulation layer is not lowered by the agents. Moreover, since the conductor circuit is buried into the insulation layer by a pressure applied when the conductor circuit is transferred, it is possible to obtain a wiring board which is also excellent in adhesion of the conductor circuit to the insulation layer.

The invention provides a production method of a wiring board comprising the steps of:

overlaying a high-resistance-metal-layer-side face of a transfer sheet including a base and a high-resistance metal layer of 20 $\mu\Omega$·cm or more on the base and in which at least part of the high-resistance metal layer is formed by laser-processing, on a surface of an insulation layer;

pressure-contacting the transfer sheet and the insulation layer; and removing the base of the transfer sheet to transfer the high-resistance metal layer onto the insulation layer, whereby forming a resistor.

Further, according to the invention, since the method comprises the steps of overlaying the high-resistance-metal-layer-side face of the transfer sheet of the above construction on the surface of the insulation layer, pressure-contacting the transfer sheet and the insulation layer, and removing the base of the transfer sheet to transfer the high-resistance metal layer onto the insulation layer, whereby forming a resistor, it is possible to easily form a resistor having a highly accurate resistance value on the insulation layer without damaging the insulation layer, and since the resistor is buried into the insulation layer by a pressure applied when the resistor is formed by transferring the high-resistance metal layer, it is possible to obtain a wiring board which is also excellent in adhesion of the resistor to the insulation layer.

The invention provides a production method of a wiring board comprising the steps of:

overlaying an organic-resin-film-side face of a transfer sheet including a base and a metal layer formed into a circuit pattern on the base and in which an organic resin film having light-transmittance in a wavelength of 150 to 400 nm of 0.4 or less is formed on a surface of the metal layer, on a surface of an insulation layer;

pressure-contacting the transfer sheet and the insulation layer; and removing the base of the transfer sheet to transfer the organic resin film and the metal layer onto the surface of the insulation layer, whereby forming the conductor circuit.

According to the invention, since the method comprises the steps of overlaying the organic-resin-film-side face of the transfer sheet of the above construction on the surface of the insulation layer, pressure-contacting the transfer sheet and the insulation layer, and removing the base of the transfer sheet to transfer the organic resin film and the metal layer onto the surface of the insulation layer, whereby forming the conductor circuit, it is possible to easily form a minute conductor circuit which is excellent in high-frequency transmission characteristic on the insulation layer, and since the metal layer is transferred onto the insulation layer as the organic resin film is attached thereon, the insulation layer and the metal layer are adhered to each other via the organic resin film, and it is possible to obtain a wiring board which is also excellent in adhesion of the conductor circuit to the insulation layer by making the adhesion of the organic resin film favorable.

The invention provides a production method of a wiring board comprising the steps of:

from a transfer sheet including a base and a metal layer formed into a circuit pattern on the base and wherein an organic resin film having light-transmittance in a wavelength of 150 to 400 nm of 0.4 or less is formed on the surface of the metal layer, removing the organic resin film;

overlaying a metal-layer-side face of the transfer sheet on a surface of an insulation layer;

pressure-contacting the transfer sheet and the insulation layer; and removing the base of the transfer sheet to transfer the metal layer onto the surface of the insulation layer, whereby forming the conductor circuit.

Further, according to the invention, since the method comprises the steps of removing the organic resin film of the transfer sheet of the above construction, overlaying the metal-layer-side face of the transfer sheet on the surface of the insulation layer, pressure-contacting the transfer sheet and the insulation layer, and removing the base of the transfer sheet to form transfer the metal layer onto the insulation layer, whereby the conductor circuit, it is possible to easily form a minute conductor circuit on the insulation layer, and it is possible, by directly transferring the metal layer onto the insulation layer after removing the organic resin film, to use a uniform material of the insulation layer around the conductor circuit. As a result, it is possible to obtain a wiring board which is more excellent in high-frequency transmission characteristic.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Next, a transfer film of the present invention and a wiring board produced by the use of the same will be described in detail based on the appended drawings.

(First Embodiment)

Figure 1:
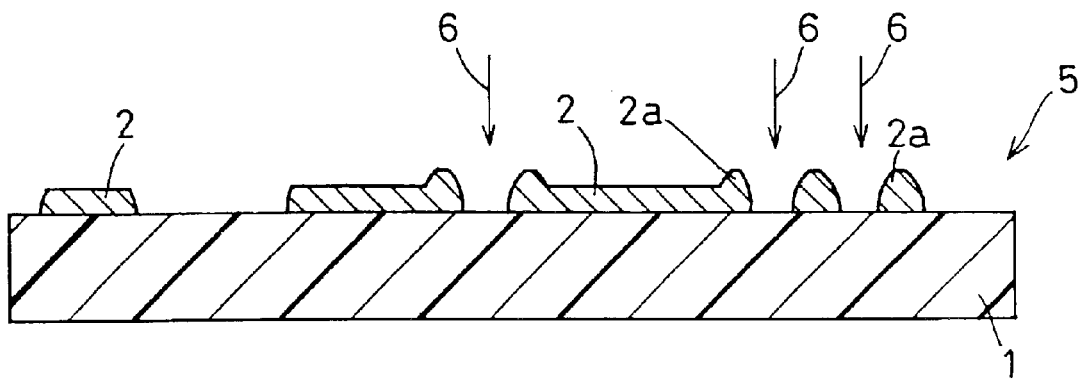
FIG. 1 is a sectional view showing an example of a transfer sheet of a first embodiment of the present invention.
Figure 2A:
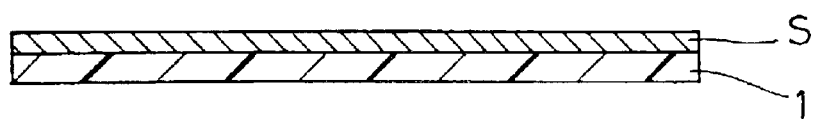
FIGS. 2A to 2C are sectional views in individual processes for explaining an example of a production method for producing a transfer sheet of the invention.
Figure 2B:
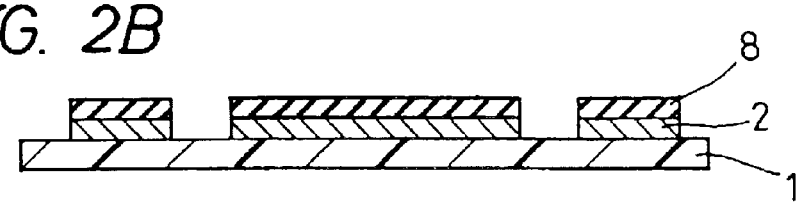
Figure 2C:
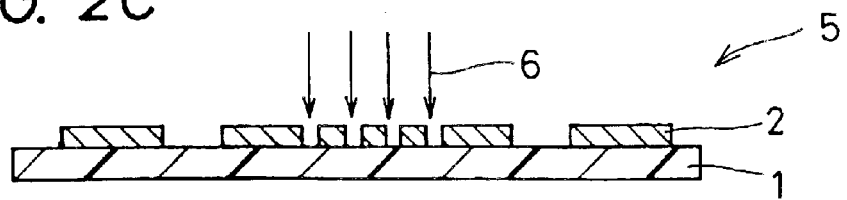
Figure 3A:
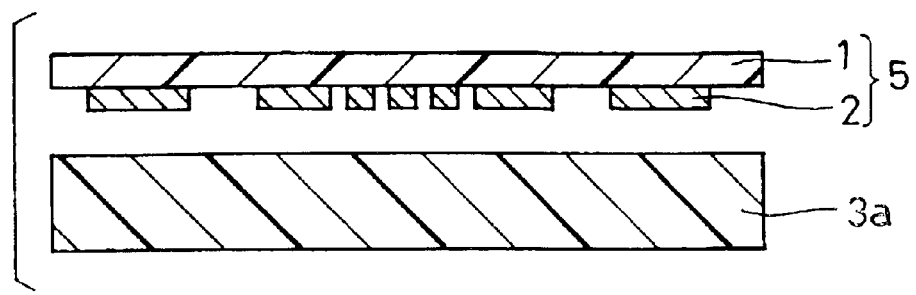
FIGS. 3A to 3C are sectional views in individual processes for explaining an example of a production method for producing a wiring board of the invention by the use of a transfer sheet of the invention.
Figure 3B:
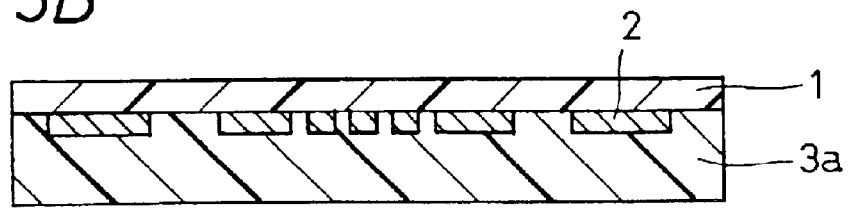
Figure 3C:
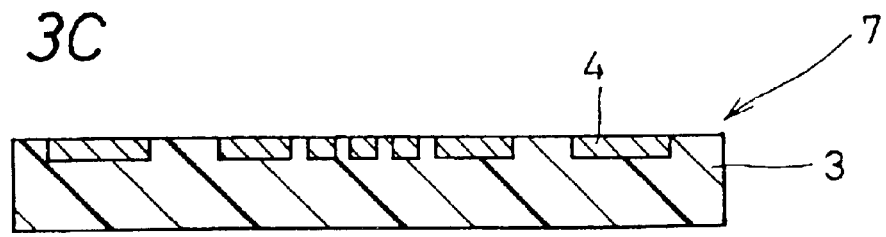
Figure 4:
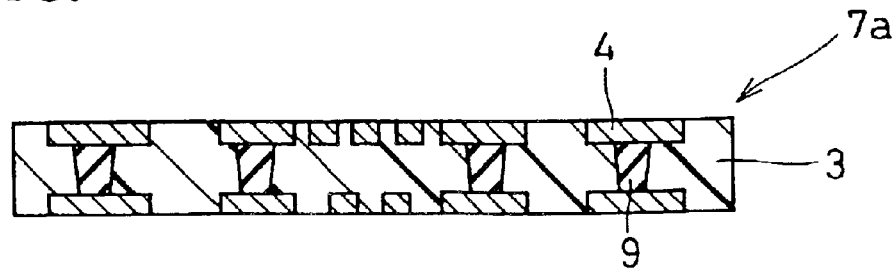
FIG. 4 is a sectional view showing an example of a wiring board of the first embodiment of the invention.
Figure 5:
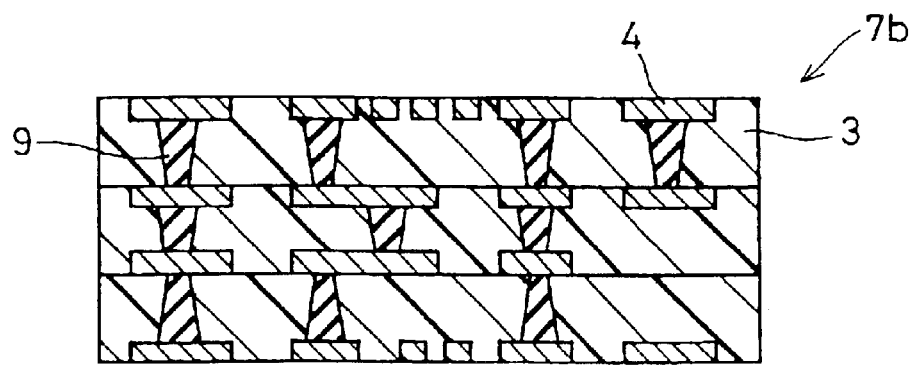
FIG. 5 is a sectional view showing another example of the wiring board of the first embodiment of the invention.

FIG. 1 is a sectional view showing an example of a transfer sheet of a first embodiment of the invention, FIGS. 2A to 2C are sectional views in individual processes for explaining an example of a production-method for producing a transfer sheet of the invention, FIGS. 3A to 3C are sectional views in individual processes for explaining an example of a production method of a wiring board of the invention by the use of a transfer sheet of the invention, FIG. 4 is a sectional view showing an example of a wiring board of the first embodiment of the invention, and FIG. 5 is a sectional view showing another example of the wiring board of the first embodiment of the invention. In these views, reference numeral 1 denotes a base, reference symbol S denotes a metal layer, reference numeral 2 denotes a metal layer formed into a circuit pattern, reference numeral 3 denotes an insulation layer, and reference numeral 4 denotes a conductor circuit. A transfer sheet 5 of the invention is constituted mainly by the base 1 and the metal layer 2 formed into a circuit pattern, and a wiring board 7 of the invention is constituted mainly by the insulation layer 3 and the conductor circuit 4.

The base 1 constituting the transfer sheet 5 has a function as a base member for processing the metal layer S into a circuit pattern and for transferring the metal layer 2 formed into a circuit pattern onto the surface of the wiring board 7. The base 1 is a resin film of polyester, polyethylene terephthalate, polyimide, polyphenylene sulfide, vinyl chloride, polypropylene, liquid crystal polymer or the like, or a metal plate of stainless steel or the like.

It is appropriate that the thickness of the base 1 is 10 to 500 μm, and desirably, it is preferable that it is 20 to 300 μm. In a case where the thickness of the base 1 is less than 10 μm, there is a tendency to cause the base 1 to be deformed or bent and cause the metal layer 2 formed into a circuit pattern on the surface thereof to be apt to have a break. In a case where the thickness of the base 1 is more than 500 μm, the base 1 does not have flexibility, and there is a tendency to make it difficult to peel off the base 1 from the surface of the wiring board 7.

Further, the transfer sheet 5 has the metal layer 2 formed into a circuit pattern on the base 1. The metal layer 2 is made of metal which is suitable for forming the conductor circuit 4 of the wiring board 7, and, for example, low-resistance metal such as gold, silver, copper, aluminum or alloy thereof is preferably used. It is appropriate that the thickness thereof is 1 to 100 μm, and desirably, it is preferable that it is 5 to 50 μm. In a case where the thickness of the metal layer 2 is less than 1 μm, the resistivity of the conductor circuit 4 tends to become high. In a case where the thickness of the metal layer 2 is more than 100 μm, when the metal layer 2 is transferred onto the insulation layer 3, the insulation layer 3 is largely deformed, and the metal layer 2 is deeply buried into the insulation layer 3 and the insulation layer 3 is largely distorted, so that there is a tendency to make the wiring board 7 apt to be deformed.

The metal layer S to become the circuit-pattern-shaped metal layer 2 is metal foil formed by rolling, or a metal thin film formed by a well-known method such as plating, spattering, vacuum deposition, ion-plating, or application of a conductive resin film. Moreover, the metal layer S and the base 1 may be adhered to each other by a well-known adhesive of acrylic, rubber, silicon, epoxy or the like, and the appropriate thickness thereof is 1 to 20 μm although it depends on the adhesion force of the adhesive.

Further, in the transfer sheet 5 of the invention, the metal layer 2 is formed into a circuit pattern, and at least part of the circuit pattern is formed by laser-processing. This is important in the invention.

According to the transfer sheet 5 of the invention, since at least part of the circuit pattern of the metal layer 2 is formed by laser-processing, it is possible, without using an etching process or a plating process in which it is considerably difficult to control the speed of etching or the speed of plating deposition of a minute part of the conductor circuit 4, to remove an unnecessary part of the metal layer S by emitting laser light 6 which has a minute beam diameter. Therefore, it is possible to form the minute conductor circuit 4 having a width and pitch of 50 μm or less, and consequently, it is prevented that the conductor circuit 4 has a break because of excessive etching or a failure of plating deposition or the conductor circuit 4 is short-circuited because of the residue of etching or a short of plating.

Laser-processing for forming at least part of the circuit pattern of the metal layer 2 can be performed by emitting laser such as YAG laser, excimer laser, copper vapor laser or carbon dioxide laser onto a part of the metal layer S to become an unnecessary part from the side of the metal layer S and removing the part of the metal layer S. In view of easily forming the conductor circuit 4 that has favorable processibility to the metal layer S and has a minute width and pitch of 50 μm or less, it is desirable to use laser having a wavelength in the ultraviolet region such as third harmonic YAG laser, fourth harmonic YAG laser, excimer laser or second harmonic copper vapor laser.

In a method of forming the metal layer S into a circuit pattern, all may be formed by laser-processing, whereas only a minute part may be formed by laser-processing after forming a part of the metal layer S other than the minute part by a well-known photo lithography method in view of shortening a processing time. In the production method, firstly, as shown by the sectional view in FIG. 2A, for example, metal foil to become the metal layer S is adhered onto the base 1. Then, as shown by the sectional view in FIG. 2B, a resist layer 8 is formed on the surface of the metal layer S to form into a pattern by the well-known photo lithography method, and an exposed part of the metal layer S is removed. After that, as shown by the sectional view in FIG. 2C, the resist layer is removed, and then a minute part is processed by the laser light 6, whereby the metal layer S can be formed into a circuit pattern.

Further, in the transfer sheet 5 of the invention, it is preferable that a rim of a circuit pattern part of the metal layer 2 formed by laser-processing has a protruding portion 2a which protrudes to the opposite side to the base 1 as shown in the sectional view of a transfer sheet of FIG. 1.

According to the transfer sheet 5 of the invention, since the rim of the circuit pattern part of the metal layer 2 formed by laser-processing is made to protrude to the opposite side to the base 1, it is possible to make an anchor effect high by burying and fixing the protruding portion 2a into the insulation layer 3 at the time of transferring the metal layer 2 of the transfer sheet 5 onto the insulation layer 3. Therefore, it is possible to stably transfer the minute conductor circuit 4 onto the insulation layer 3 without causing a transfer failure, and consequently, it is possible to obtain the transfer film 5 that enables production of the wiring board 7 having the minute conductor circuit 4.

Regarding the protruding portion 2a, in view of decreasing transfer failures by burying into the insulation layer 3 and increasing the adhesion to the insulation layer 3 by an anchor effect, it is preferable that the height of the protruding portion 2a is 1 μm or more. Moreover, in view of making it hard to cause distortion of the insulation layer 3 due to large deformation of the insulation layer 3 at the time of transferring the metal layer 2 onto the insulation layer 3, it is preferable that it is 20 μm or less.

Further, in the case of forming the metal layer S into a circuit pattern by removing an unnecessary part by laser-processing, the rim of the circuit pattern formed by laser-processing is featured by part of the metal layer 2 fused and deformed by thermal fusion, and can be distinguished from that of the metal layer 2 formed into a circuit pattern by the well-known etching method.

The protruding portion 2a can be formed by thermal deformation of the rim of the circuit pattern part of the metal layer 2 by controlling laser conditions at the time of laser processing, and can be formed so as to have a desired height by, for example, controlling conditions such as laser energy, laser pulse frequency and the number of emissions.

Further, by emitting laser to the metal layer 2 from a specified distance, it is possible to form the metal layer 2 into a linear shape whose both ends in a width direction are formed by laser-processing, and in a case where the width of the linear metal layer 2 is more than 50 μm, a section thereof in the width direction of the linear metal layer 2 has such a shape that both ends have protruding portions. On the other hand, in a case where the linear metal layer 2 is formed into a minute line which is 50 μm or less in width, protruding portions formed on the rim of the circuit pattern formed by laser-processing are formed in almost the same position in almost the middle of the linear metal layer 2 in the width direction, and the linear metal layer 2 has such a shape that almost the middle portion in the width direction protrudes.

In order to increase the adhesion of the metal layer 2 to the insulation layer 3 described later, it is preferable to rough the surface thereof by treatment such as buffing, blasting, brushing, plasma treatment, corona treatment, ultraviolet treatment or chemical treatment.

Next, the wiring board 7 of the invention will be described based on FIGS. 3A to 3C. FIGS. 3A to 3C are sectional views in individual processes for explaining an example of a production method for producing a wiring board of the invention by the use of a transfer sheet or the invention. In these views, reference numeral 3a denotes a precursor sheet to become the insulation layer 3.

The insulation layer 3 has a function as a base of the conductor circuit 4 and electronic components (not shown in the views), and is made of: a thermosetting resin of unset state or half-set state such as an epoxy resin, a bismaleimide triazine resin, a thermosetting polyphenylene ether resin or a phenol resin; a thermoplastic resin such as a polyimide resin, a fluorocarbon resin, a polyphenylene ether resin, a liquid crystal polymer resin or an aramid resin; or a ceramic green sheet of aluminum oxide, glass ceramic or the like.

The precursor sheet 3a becomes the insulation layer 3 that constitutes the wiring board 7 to be produced finally, by hardening in the process of hearing and hardening in the case of using a thermosetting resin, and by sintering in the baking process in the case of using a ceramic green sheet.

Further, by setting the porosity of the precursor sheet 3a in a dry state to 3 to 40% by volume, at the time of transferring and burying the metal layer 2 into the precursor sheet 3a, it is possible to flatten without causing a rise of the precursor sheet 3a around the metal layer 2, and it is possible to facilitate discharge of air existing between the metal layer 2 and the precursor sheet 3a and prevent entrainment of air bubbles. In a case where the porosity in the dry state is more than 40% by volume, there is a possibility that after a plurality of precursor sheets 3a are laminated, pressurized and hardened by heat, air holes are left in the precursor sheets 3a, the air holes absorb moisture in the air, and an insulation performance is lowered. Therefore, it is preferable to set the porosity of the precursor sheet 3a in the dry state in a range from 3 to 40% by volume.

The porosity of the precursor sheet 3a in the dry state can be set to a desired value by controlling drying conditions such as a drying temperature and a heating speed as necessary in the drying process at the time of shaping the precursor sheet 3a into a sheet by a well-known sheet shaping method.

Further, in a case where the precursor sheet 3a is made of a thermosetting resin or a thermoplastic resin, in order to control a thermal expansion coefficient of the insulation layer 3, and in order to increase mechanical strength, it is preferable to use a material made by: adding a filler such as aluminum oxide, silicon oxide, titanium oxides barium oxide, strontium oxide, zirconium oxide, calcium oxide, zeolite, silicon nitride, aluminum nitride, silicon carbide, potassium titanate, barium titanate, strontium titanate, calcium titanate, aluminum borate, barium stannate, barium zirconate or strontium zirconate, into a resin material; impregnating a stiffener such as glass cloth made by inweaving fibrous glass into a cloth or nonwoven cloth of heat-resistant organic resin fiber with an organic resin such as an epoxy resin or thermosetting polyphenylene ether; or coating the upper and lower faces of a heat-resistant film of liquid crystal polymer, aramid or the like with organic resin adhesion layers of an epoxy resin, a thermosetting polyphenylene ether or the like. Particularly, in view of obtaining a favorable high-frequency transmission performance, and in view of forming a minute through conductor 9 having a diameter of 100 $\mu$m or less in a favorable manner, it is preferable to use a precursor sheet made by coating the upper and lower faces of a liquid crystal polymer film with organic resin adhesion layers. More specifically, it is preferable that the precursor sheet 3a to become the insulation layer 3 includes a liquid crystal polymer film and organic resin adhesion layers which coat both faces of the liquid crystal polymer film opposed to each other.

Liquid crystal polymer is polymer which exhibits liquid crystallinity in a molten state or a solution state, or polymer which has a behavior of optical double refraction, and generally includes lyotropic liquid crystal polymer which exhibits liquid crystallinity in a solution state, thermotropic liquid crystal polymer which exhibits liquid crystallinity in a molten state, and all of the type 1, type 2 and type 3 of liquid crystal polymers categorized by thermal deformation temperatures. In view of heat cycle reliability, solder heat-resistance and processibility, one having a melting point at a temperature of 200 to 400° C., more specifically, at a temperature of 250 to 350° C. is preferable.

The precursor sheet 3a is produced by the following method in a case where the precursor sheet 3a is made by, for example, coating the upper and lower faces of a heat-resistant film of liquid crystal polymer or the like with organic resin adhesion layers of an epoxy rein, thermosetting polyphenylene ether or the like.

Firstly, a liquid crystal polymer film is formed by a well-known inflation method or the like. Then, after surface treatment by plasma treatment or the like is applied to the upper and lower surfaces thereof, for example, after organic resin adhesion layers are formed by a sheet shaping method such as a well-known doctor blade method by the use of paste obtained by adding an organic resin such as a thermosetting polyphenylene ether resin, a solvent, a plasticizer, a dispersant and so on to inorganic insulation powder of silicon oxide having a particle diameter of 0.1 to 15 $\mu$m, or after organic resin adhesion layer are formed on the upper and lower surfaces of the liquid crystal polymer film by immersing the liquid crystal polymer film into the above paste and pulling up vertically, this is heated and dried for five minutes to three hours at a temperature of 60 to 100° C., whereby the precursor sheet is produced.

Next, in a production method of the wiring board 7, firstly, the transfer sheet 5 of the invention and the precursor sheet 3a are registered as shown by the sectional view in FIG. 3A, and then laminated as shown by the sectional view in FIG. 3B, and a pressure of approximately 1 to 50 MPa is applied. At this moment, in order to increase the adhesion of the metal layer 2 and the precursor sheet 3a, they may be warmed at 100 to 200° C. By using a thermoplastic resin to be softened by heat, a thermosetting resin of half-set state or a ceramic green sheet as the precursor sheet 3a, it is possible to bury the metal layer 2 into the precursor sheet 3a by a mechanical pressure.

Then, as shown by the sectional view in FIG. 3C, by peeling off the base 1 or by removing the base 1 by a method such as etching, the metal layer 2 is transferred to the precursor sheet 3a, and by heating and hardening finally, the wiring board 7 having the conductor circuit 4 can be produced.

Further, as shown by the sectional view in FIG. 4, a wiring board of the invention may be a wiring board 7a which has the conductor circuits 4 formed by the use of transfer films of the invention on both the upper and lower faces of the insulation layer 3. Furthermore, it is also possible to electrically connect the conductor circuits 4 on the upper and lower faces via the through conductor 9 formed in the insulation layer 3. Still further, as shown by the sectional view in FIG. 5, a wiring board 7b may be formed by laminating the insulation layers 3 having the conductor circuits 4 formed by the use of transfer films of the invention.

The through conductor 9 has a diameter of approximately 20 to 150 μm, and has a function of electrically connecting the conductor circuits 4 located vertically on both sides of the insulation layer 3. The through conductor 9 is formed by applying a puncturing process by laser to form a through hole in the insulation layer 3 and then burying conductive paste made of copper, silver, gold, solder or the like into the through hole by a well-known screen printing method.

A wiring board of the invention is not confined within the above embodiment, various changes are allowed in a range without deviating from the scope of the invention, and, for example, although the wiring boards 7, 7a, 7b described in the above embodiment are formed by one insulation layer 3 or by laminating three insulation layers 3 to be multilayered, a wiring board may be produced by laminating two or four or more insulation layers 3 to be multilayered. Moreover, by laminating one or two or more insulation layers 3 on which the conductor circuits 4 are formed by the use of the transfer sheets 5 of the invention on the surface of a well-known core board, a wiring board may be produced. Furthermore, solder resists may be formed on the surfaces of the wiring boards 7, 7a, 7b of the invention.

EXAMPLES

Next, a transfer sheet and a wiring board of the invention were evaluated by producing the following samples.

Example 1

Onto the substantially full face of a base made of polyethylene terephthalate having a thickness of 100 μm, an adhesive made of an acrylic resin was applied so that the face had adhesion, and-copper foil having a thickness of 12 μm and surface roughness Ra (arithmetic average roughness) of 0.8 μm was adhered. After that, by applying a photoresist to perform exposure development and then immersing into an iron chloride solution to remove a non-pattern portion by etching, a circuit pattern was formed. The circuit pattern at this moment was relatively rough, and a pattern width and a pattern pitch thereof were more than 50 μm. Furthermore, by emitting third harmonic YAG laser to part of the circuit pattern and removing the copper foil, a minute circuit pattern having a pattern width and pattern pitch of 50 μm or less was formed, whereby a transfer sheet was produced.

The minute circuit pattern part included five parallel circuit patterns whose pattern widths and pattern pitches were equally 15 μm and lengths were 1 cm.

As a result of observation of the minute circuit pattern part of the obtained transfer circuit, favorable circuit patterns were formed. Moreover, the result of an insulation test for measuring insulation resistance by applying a voltage between the circuit patterns was favorable, and a decrease of insulation resistance due to a short was not recognized.

Comparison Example 1

A transfer sheet used as a comparison example 1 was produced in the same manner as the comparison example, except forming all circuit patterns including a minute circuit pattern by using a photo resist and removing copper foil of a non-pattern part by etching without using third harmonic YAG laser.

As a result of observation of the minute circuit pattern part of the obtained transfer sheet for the comparison example, a non-pattern portion was left between the circuit patterns because of an etching failure, and a short of the circuit pattern was recognized.

Example 2

Except controlling the strength of third harmonic YAG laser and making the rim of the minute circuit pattern part protrude in the example 1, a transfer sheet was produced in the same manner as in the example 1. Next, by registering and adhering the transfer sheet on an insulation film made by forming thermosetting polyphenylene ether resin coating layers having a thickness of 20 μm on the upper and lower faces of a liquid crystal polymer film having a thickness of 50 μm or on a polyimide film having a thickness of 100 μm, and then peeling off the base, a conductor circuit made of copper was formed, and by finally heating for one hour at a temperature of 200° C. under a pressure of 3 MPa to completely harden, a wiring board was produced.

There were three kinds of protrusion heights of the rims of the minute circuit patterns, which were 0 μm, 5 μm and 10 μm.

As a result of observation of the conductor circuits of the obtained wiring boards, regarding a wiring board using an insulation film made by forming polyphenylene ether resin coating layers on the upper and lower faces of a liquid crystal polymer film, it was found that a circuit pattern was favorably transferred and a minute conductor circuit was favorably formed in the case of any protrusion height of the rim of the minute circuit pattern. However, regarding a wiring board using a polyimide film, in a case where the protrusion height of the rim of the minute circuit pattern was 0 μm, a transfer failure of the minute circuit pattern part occurred, and a minute conductor circuit was not formed. On the other hand, regarding the wiring board using a polyimide resin film, in the cases of protrusion heights of 5 μm and 10 μm, favorable conductors were formed, and it was found to be excellent.

(Second Embodiment)

Figure 6:
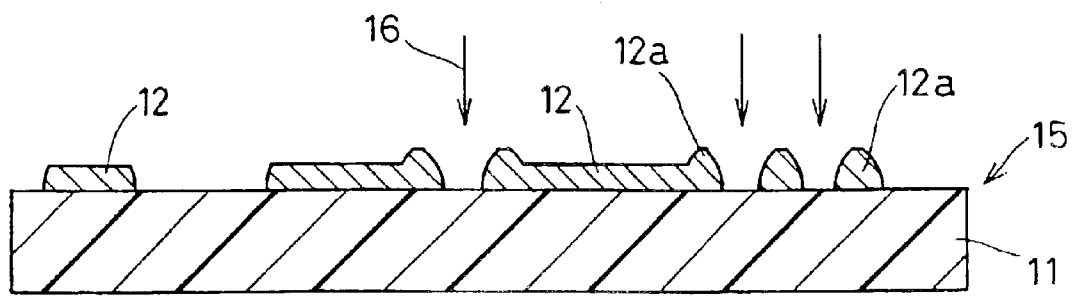
FIG. 6 is a sectional view showing an example of a transfer sheet of a second embodiment of the invention.
Figure 7A:
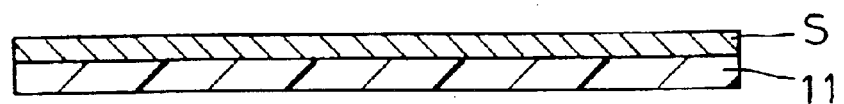
FIGS. 7A to 7C are sectional views in individual processes for explaining an example of a production method for producing a transfer sheet of the invention.
Figure 7B:
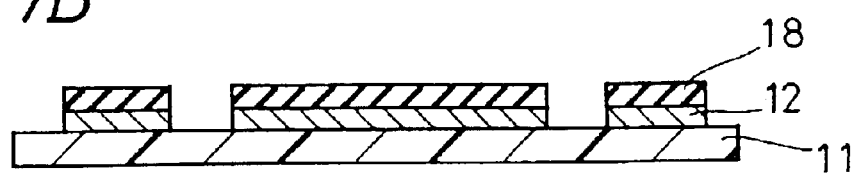
Figure 7C:
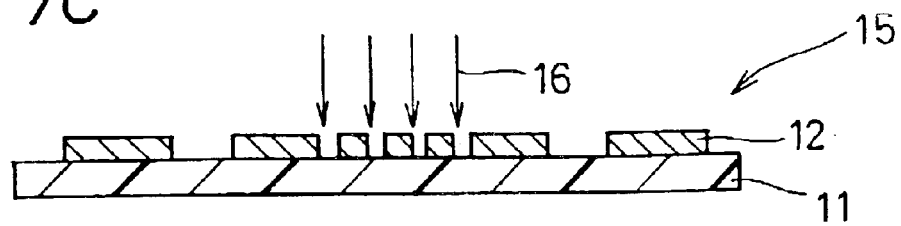
Figure 8A:
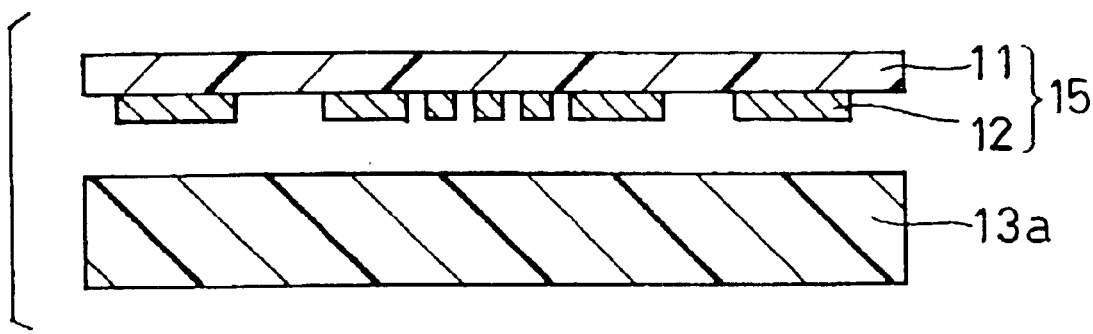
FIGS. 8A to 8C are sectional views in individual processes for explaining an example of a production method for producing a wiring board of the invention by the use of a transfer sheet of the invention.
Figure 8B:
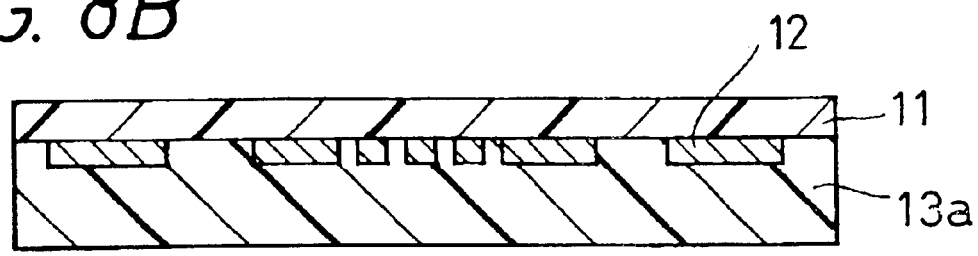
Figure 8C:
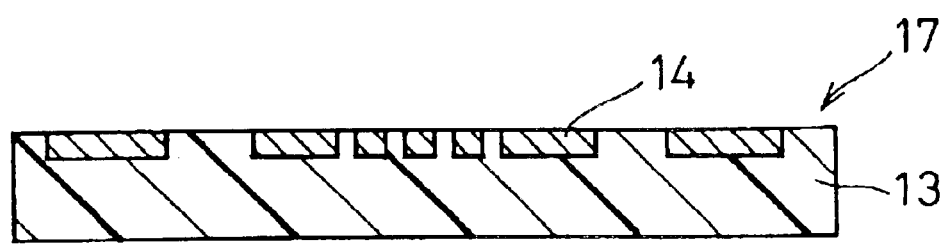
Figure 9:
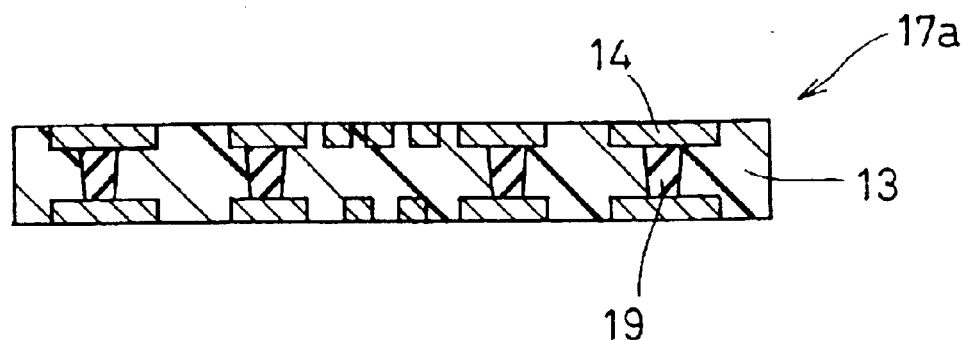
FIG. 9 is a sectional view showing an example of a wiring board of the second embodiment of the invention.
Figure 10:
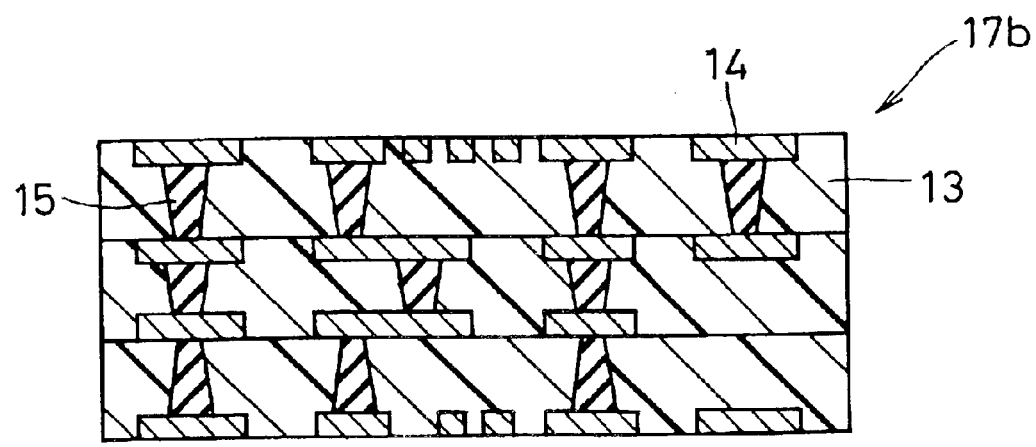
FIG. 10 is a sectional view showing another example of the wiring board of the second embodiment of the invention.

FIG. 6 is a sectional view showing an example of a transfer sheet of a second embodiment of the invention, FIGS. 7A to 7C are sectional views in individual processes for explaining an example of a production method for producing a transfer sheet of the invention, FIGS. 8A to 8C are sectional views in individual processes for explaining an example of a production method for producing a wiring board of the invention by using a transfer sheet of the invention, FIG. 9 is a sectional view showing an example of a wiring board of the second embodiment of the invention, and FIG. 10 is a sectional view showing another example of the wiring board of the second embodiment of the invention. In these views, reference numeral 11 denotes a base, reference symbol S denotes a metal layer, reference numeral 12 denotes a metal layer formed into a circuit pattern, reference numeral 13 denotes an insulation layer, and reference numeral 14 denotes a conductor circuit. A transfer sheet 15 of the invention is constituted mainly by the base 11 and the metal layer 12 formed into a circuit pattern. A wiring board 17 of the invention like that of the aforementioned embodiment is constituted mainly by the insulation layer 13 and the conductor circuit 14.

The base 21 constituting the transfer sheet 15 has a function as a base member for processing the metal layer S into a circuit pattern and for transferring the metal layer 12 formed into a circuit pattern onto the surface of the wiring board 17, and light-transmittance in any wavelength in a range from 150 to 400 nm thereof is 0.6 or more. In the invention, this is important.

According to the transfer sheet 15 of the invention, since light-transmittance in any wavelength of 150 to 400 nm of the base is set to 0.6 or more, when the metal layer is processed into a circuit pattern by laser light 16 having a wavelength of 150 to 400 nm which is excellent in fine processing, the base 11 can make most part of the laser light 16 transmit without absorbing. Therefore, it is possible to form a minute circuit pattern which is 50 $\mu$m or less in width and pitch without damaging the base 11 by the laser light 16, and consequently, it is possible to obtain the transfer sheet 15 that enables the base 11 to keep holding the metal layer 2 of a minute circuit pattern accurately and that is appropriate for forming the metal layer 2 of a minute circuit pattern which is excellent in accuracy of position.

As the base 11, one having light-transmittance in any wavelength of 150 to 400 nm of 0.6 or more is used, and in specific, a transparent film which consists of molecules having a chemical bond of bond energy of 299 kJ/mol or more equivalent to photon energy of light having a wavelength of 400 nm and which is formed so that the molecules are in a random orientation of amorphous state is used. A preferably used transparent film is, for example, a transparent polymer film which contains a benzene ring, an unsaturated bond or the like having large chemical bond energy such as polycarbonate or polyphenylene ether in a molecular chain and which is formed into an amorphous state.

Since most polymer films have bond energy more than bond energy of 797 kJ/mol equivalent to photon energy of light of 150 nm, light-transmittance is less than 0.6 in a wavelength less than 150 nm.

Further, although it is important to the base 11 that at the time of emitting the laser light 16 of 400 nm or less which is excellent in fine processing and removing an unnecessary part of the metal layer S, the laser light 6 does not damage the base 11 when transmitting the base 11, it tends to become difficult to perform fine processing of 50 $\mu$m or less with laser having a wavelength of more than 400 nm. Therefore, in view of causing laser light of 400 nm or less to transmit, it is preferable that light-transmittance in 400 nm or less of the base 11 is 0.6 or more.

In a case where light-transmittance in a wavelength of 150 to 400 nm of the base 11 is less than 0.6, there is a danger that the laser light 16 entering the base 11 damages the base 11, and consequently, the base 11 is distorted and the circuit-pattern-shaped metal layer 12 on the base 11 is displaced. Therefore, light-transmittance in a wavelength of 150 to 400 nm of the base 11 needs to be 0.6 or more.

Further, it is appropriate that the thickness of the base 11 is 10 to 500 $\mu$m, and desirably, it is preferable that it is 20 to 300 $\mu$m in the same manner as that of the base 1 of the aforementioned embodiment.

Furthermore, the transfer sheet 15 has the metal layer S like that of the aforementioned embodiment on the base 11.

Further, in the transfer sheet 15 of the invention, the metal layer 12 is formed into a circuit pattern, and at least part of the circuit pattern is formed by laser-processing. This is also important in the invention.

According to the transfer sheet 15 of the invention, since the metal layer 12 is constituted by forming at least part of the circuit pattern by laser-processing, it is possible, without using an etching process or a plating process in which it is considerably difficult to control the speed of etching or the speed of plating deposition of a minute part of the conductor circuit 14, to remove an unnecessary part of the metal layer S by emitting the laser light 16 having a minute beam diameter. Therefore, it is possible to form the minute conductor circuit 14 that has a width and pitch of 50 $\mu$m or less, and consequently, it is prevented that the conductor circuit 14 has a break because of excessive etching or a failure of plating deposition or the conductor circuit 14 is short-circuited because of the residue of etching or a short of plating.

In the embodiment, in laser-processing for forming at least part of the circuit pattern of the metal layer 2, in view of easily forming the pattern-shaped metal layer 2 having favorable processibility to the metal layer S and having a minute width and pitch of 50 $\mu$m or less, it is preferable to use laser which has a wavelength of 150 to 400 nm such as third harmonic YAG laser, fourth harmonic YAG laser, excimer laser or second harmonic copper vapor laser. Moreover, in view of making most transmit the base 11, it is important to use laser light having a wavelength in which light-transmittance in a wavelength of 150 to 400 nm of the base 11 is 0.6 or more.

According to the transfer sheet 15 of the invention, since laser-processing is performed by the laser light 16 having a wavelength in which light-transmittance is 0.6 or more in the above construction, most of the emitted laser light transmits the base, and molecular motion of constituent molecules of the base due to laser light absorption hardly occurs. Therefore, heat is hardly generated in the base by molecular motion, with the result that deformation of the base by heat is little, and it is possible to form a minute conductor circuit which is excellent in accuracy of position.

A method of forming the metal layer 12 into a circuit pattern is the same as in the aforementioned embodiment. Moreover, in the production method, as in the aforementioned embodiment, firstly, for example, metal foil to become the metal layer S is adhered onto the base 11 as shown by the sectional view in FIG. 7A, a resist layer 18 is formed on the surface of the metal layer S to form into a pattern by the well-known photo lithography method and the exposed metal layer S is removed as shown by the sectional view in FIG. 7B, the resist layer is removed as shown by the sectional view in FIG. 7C, and thereafter, a minute part is processed by the laser light 16, whereby the metal layer S can be formed into a circuit pattern.

Further, in the transfer sheet 15 of the invention, as in the aforementioned embodiment, it is preferable to make the rim of the circuit pattern part of the metal layer 12 formed by laser-processing have a protruding portion 12a which protrudes to the opposite side to the base 11 as shown in the sectional view of the transfer sheet in FIG. 6.

According to the transfer sheet 15 of the invention, since the rim of the circuit pattern part of the metal layer 12 formed by laser-processing is made to protrude to the opposite side to the base 11, it is possible to obtain the same effect as in the aforementioned embodiment.

The height of the protruding portion 12a is the same as the protruding portion 2a of the aforementioned embodiment.

Further, in the case of forming the metal layer S into a circuit pattern by removing an unnecessary part by laser-processing, as in the aforementioned embodiment, the rim of the circuit pattern formed by laser-processing is featured by part of the metal layer 12 fused and deformed by thermal fusion, and can be distinguished from that of the metal layer 12 formed into a circuit pattern by the well-known etching method.

The protruding portion 12a can be formed by thermal deformation of the rim of the circuit pattern part of the metal layer 12 by controlling laser conditions at the time of laser-processing, and can be formed so as to have a desired height by, for example, controlling laser conditions such as laser energy, laser pulse frequency and the number of emissions.

Further, by emitting laser to the metal layer 12 from a specified distance, it is possible to form the metal layer 12 into a linear shape whose both ends in the width direction are formed by laser-processing, and in a case where the width of the linear metal layer 12 is more than 50 μm, a section of the linear metal layer 12 in the width direction has a shape that both ends have protruding portions. On the other hand, in a case where the linear metal layer 12 is formed into a minute line whose width is 50 μm or less, the protruding portions formed on the rim of the circuit pattern formed by laser-processing are formed in substantially the same position in substantially the middle of the width direction of the linear metal layer 12, and the metal layer 12 is formed into a line whose substantially middle portion in the width direction protrudes.

In order to increase the adhesion of the metal layer 12 to an insulation layer 13 described later, it is preferable to rough the surface thereof by the same treatment as in the aforementioned embodiment.

Next, a wiring board 17 of the invention will be described based on FIGS. 8A to 8C. In these views, reference numeral 13a denotes a precursor sheet to become the insulation layer 13.

The insulation layer 13 has a function as a base of a conductor circuit 14 and electronic components (not shown in the views), and is made of the same material as the insulation layer 3 of the aforementioned embodiment.

The precursor sheet 13a becomes the insulation layer 13 that constitutes the wiring board 17 to be produced finally, by hardening in the process of heating and hardening in the case of using a thermosetting resin, and by sintering in the baking process in the case of using a ceramic green sheet.

Further, it is preferable to set the porosity of the precursor sheet 13a in a dry state to 3 to 40% by volume in the same manner as that of the precursor sheet 3a of the aforementioned embodiment.

The porosity of the precursor sheet 13a in the dry state can be set to a desired value in the same manner as that of the precursor sheet 3a of the aforementioned embodiment.

Further, in a case where the precursor sheet 13a is made of a thermosetting resin or a thermoplastic resin, in order to control a thermal expansion coefficient of the insulation layer 3, and in order to increase mechanical strength, it is preferable to use a material treated in the same manner as the precursor sheet 3a of the aforementioned embodiment. In particular, in view of making high-frequency transmission performance favorable, and in view of forming a minute through conductor 19 whose diameter is 100 μm or less in a favorable manner, it is preferable to use a precursor sheet made by coating the upper and lower faces of a liquid crystal polymer film with organic resin adhesion layers. More specifically, it is preferable that the precursor sheet 13a to become the insulation layer 13 includes a liquid crystal polymer film and organic resin adhesion layers which coat both faces of the liquid crystal polymer film opposed to each other as in the aforementioned embodiment.

The precursor sheet 13a is produced by the same method as in the aforementioned embodiment in a case where the precursor sheet 13a is made by, for example, coating the upper and lower faces of a heat-resistant film of liquid crystal polymer of the like with organic resin adhesion layers of an epoxy rein, thermosetting polyphenylene ether or the like.

Next, after the transfer sheet 15 of the invention and the precursor sheet 13a are registered as shown by the sectional view in FIG. 8A, they are laminated as shown by the sectional view in FIG. 8B, and a pressure of approximately 1 to 50 MPa is applied thereto. At this moment, in order to increase the adhesion of the metal layer 12 and the precursor sheet 13a, they may be warmed at 100 to 200° C. By using a thermoplastic resin to be softened by heat, a thermosetting resin of half-set state or a ceramic green sheet as the precursor sheet 13a, it is possible to bury the metal layer 12 into the precursor sheet 13a by a mechanical pressure.

Then, as shown by the sectional view in FIG. 8C, by peeling off the base 11 or by removing the base 11 by a method such as etching, transferring the metal layer 12 to the precursor sheet 13a, and finally heating and hardening, the wiring board 17 having the conductor circuit 14 can be produced.

According to the wiring board 17 of the invention, since the conductor circuit 12 is formed on the surface of the insulation layer 13 by transferring the metal layer S of the transfer sheet 15, it is possible to obtain the wiring board 17 that has the minute conductor circuit 14 having a width and pitch of 50 μm or less.

Further, according to the production method of a wiring board of the invention, it is possible to easily form the minute conductor circuit 14 having a width and pitch of 50 μm or less on the insulation layer 13, and since the conductor circuit 14 is transferred to the insulation layer 13, the insulation layer 13 is not exposed to various kinds of agents, and the characteristic of the insulation layer 13 is not lowered by the agents. Moreover, since the conductor circuit 14 is buried into the insulation layer 13 by a pressure applied when the conductor circuit 14 is transferred, it is possible to obtain the wiring board 17 that is also excellent in adhesion of the conductor circuit 14 to the insulation layer 13.

As shown by the sectional view in FIG. 9, a wiring board of the invention may be a wiring board 17a which has the conductor circuits 14 formed by the use of transfer films of the invention on both the upper and lower faces of the insulation layer 13. Furthermore, it is also possible to electrically connect the conductor circuits 14 on the upper and lower faces via a through conductor 15 formed in the insulation layer 13. Still further, as shown by the sectional view in FIG. 10, a wiring board 17b may be constituted by laminating the insulation layers 13 having the conductor circuits 14 formed by the use of transfer films of the invention.

The through conductor 19 has a diameter of approximately 20 to 150 μm, has a function of electrically connecting the conductor circuits 14 located vertically on both sides of the insulation layer 13, and is formed in the same manner as the through conductor 9 of the aforementioned embodiment.

A wiring board of the invention is not confined within the above embodiment, various changes are allowed in a range without deviating from the scope of the invention, and, for example, although the wiring boards 17, 17a, 17b described in the above embodiment are formed by one insulation layer 13 or by laminating three insulation layers 13 to be multilayered, a wiring board may be produced by laminating two or four or more insulation layers 13 to be multilayered. Moreover, a wiring board may be produced by laminating one or two or more insulation layers 13 on which the conductor circuits 14 are formed by the use of the transfer sheet 15 of the invention on the surface of a well-known core board. Furthermore, solder resists may be formed on the surfaces of the wiring boards 17, 17a, 17b of the invention.

EXAMPLE

Next, a transfer sheet and a wiring board of the invention were evaluated by producing the following samples.

Example 3

After polycarbonate dissolved in methylene chloride was formed into sheers, polycarbonate bases having a thickness of 100 μm and various transmittances were produced by controlling a drying speed by changing a drying temperature, and an adhesive made of an acrylic resin was applied to the substantially full faced of the bases to make them have adhesion and adhere copper foil having a thickness of 12 μm and surface roughness (arithmetic average roughness) Ra of 0.8 μm, whereby transfer sheets were produced. Next, after photoresists were applied onto the copper foil of the transfer sheets and exposure development was performed, they were immersed into an iron chloride solution to remove non-pattern parts by etching, whereby circuit patterns were formed. The circuit patterns at this moment were relatively rough, whose pattern width and pattern pitch were more than 50 μm. Furthermore, third harmonic YAG laser having a wavelength of 355 nm and second harmonic copper vapor laser having a wavelength of 255 nm were emitted to part of the circuit patterns, and the copper foil was removed, whereby minute circuit patterns having pattern width and pattern pitches of 50 μm or less were formed.

A minute circuit pattern part included five parallel circuit patterns whose pattern width and pattern pitch were equally 12 μm and length was 1 cm.

The result of observation of the minute circuit pattern parts of the obtained circuit patterns is shown in Table 1. In this table, regarding whether processibility was good or bad, it was represented by ○ in a case where a pattern width was 12 μm±2 μm, and represented by x in other cases.

TABLE 1

| sample No. | wavelength of used laser (nm) | light-transmittance in wavelength of used laser | processibility |
|---|---|---|---|
| 1* | 355 | 0.3 | x |
| 2* | 355 | 0.5 | x |
| 3 | 355 | 0.6 | ○ |
| 4 | 355 | 0.8 | ○ |
| 5* | 255 | 0.3 | x |
| 6* | 255 | 0.5 | x |
| 7 | 255 | 0.6 | ○ |
| 8 | 255 | 0.8 | ○ |

A sample marked with an asterisk is beyond the scope of the invention.

It was found from Table 1 that in a sample whose light-transmittance in a wavelength of 150 to 400 nm was less than 0.6, a minute pattern was displaced and a pattern pitch was largely deviated from 12 μm of a desired pitch, whereas a transfer sheet of the invention having light-transmittance in a wavelength of 150 to 400 nm of 0.6 or more was excellent, and a minute pattern having pattern width and pattern pitch of 12 μm was accurately processed without displacement.

Example 4

By the use of the transfer sheet used in the example 1 using a polycarbonate base whose light-transmittance in 355 nm was 0.8, a transfer sheet having a minute pattern was produced in the same manner as in the example 1, except controlling the strength of third harmonic YAG laser and making the rim of a minute circuit pattern protrude. Next, after the transfer sheet having a minute pattern was registered and brought into intimate contact with an insulation film made by forming thermosetting polyphenylene ether resin coating layers having a thickness of 20 μm onto the upper and lower faces of a liquid crystal polymer film having a thickness of 50 μm, or a polyimide film having a thickness of 100 μm, the base was peeled off, and a conductor circuit made of copper was formed, and lastly processed by heat for one hour at a temperature of 200° C. under a pressure of 3 MPa to completely harden, whereby a wiring board was produced.

There were three kinds of protrusion heights of the rims of the minute circuit patterns, which were 0 μm, 5 μm and 10 μm.

As a result of observation of the conductor circuits of the obtained wiring boards, it was found that regarding the wiring board using the insulation film made by forming polyphenylene ether resin coating layers onto the upper and lower faces of a liquid crystal polymer film, a circuit pattern was favorably transferred and a minute conductor circuit was favorably formed in the case of any protrusion height of the rim of the minute circuit pattern. However, regarding the wiring boards using a polyimide film, in a case where the protrusion height of the rim of the minute circuit pattern was 0 μm, a transfer failure was caused at a minute circuit pattern part and a minute conductor circuit was not formed. On the other hand, in a case where the protrusion heights of the rims of the minute circuit patterns were 2 μm and 5 μm, favorable conductors were formed on the wiring boards using polyimide films, and it was found to be excellent.

(Third Embodiment)

Figure 11:
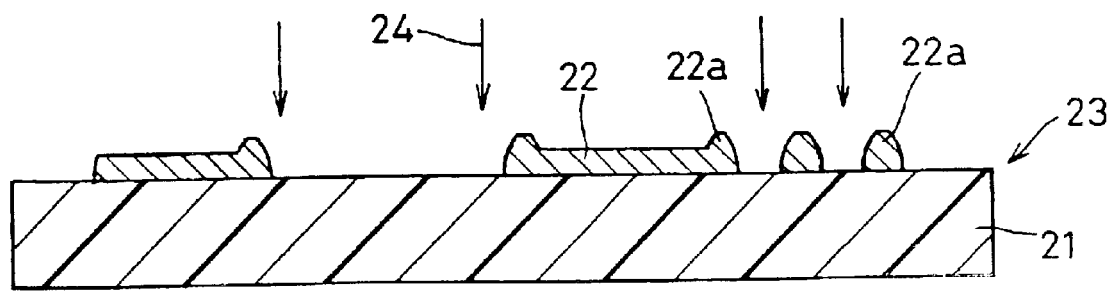
FIG. 11 is a sectional view showing an example of a transfer sheet of a third embodiment of the invention.
Figure 12A:
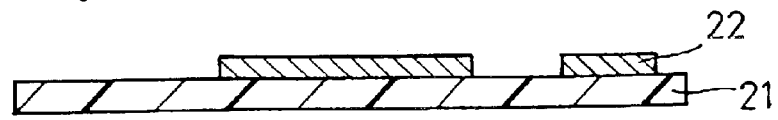
FIGS. 12A, 12B are sectional views in individual processes for explaining an example of a production method for producing a transfer sheet of the invention.
Figure 12B:
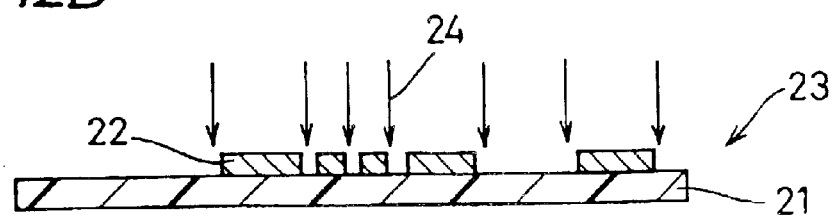
Figure 13A:
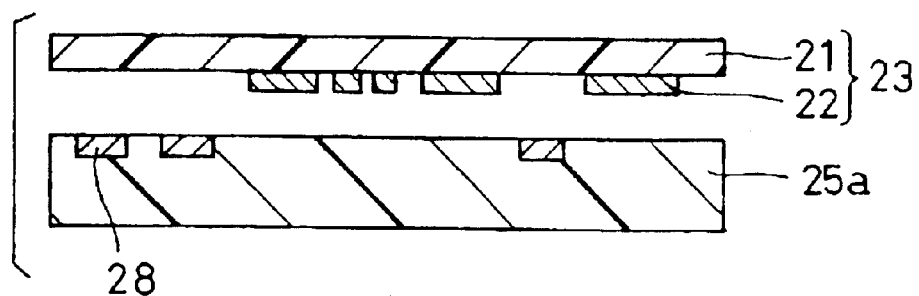
FIGS. 13A to 13C are sectional views in individual processes for explaining an example of a production method for producing a wiring board of the invention by the use of a transfer sheet of the invention.
Figure 13B:
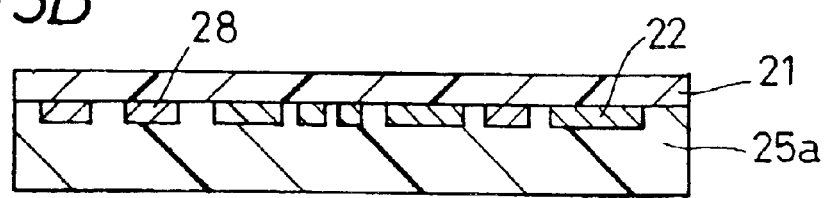
Figure 13C:
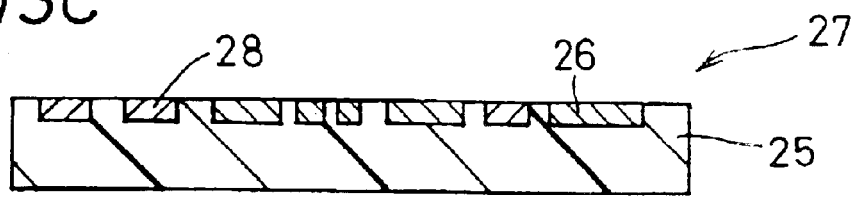
Figure 14:
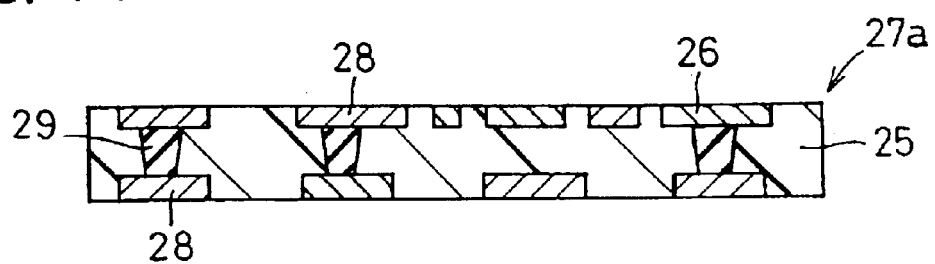
FIG. 14 is a sectional view showing an example of a wiring board of the third embodiment of the invention.
Figure 15:
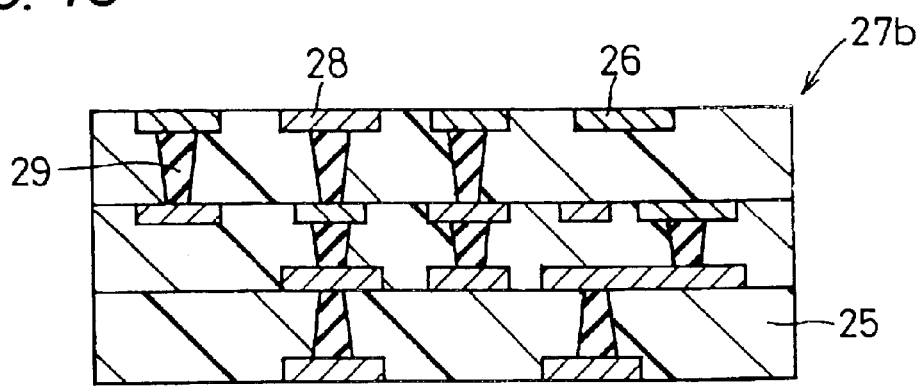
FIG. 15 is a sectional view showing another example of the wiring board of the third embodiment of the invention.

FIG. 11 is a sectional view showing an example of a transfer sheet of a third embodiment of the invention, FIGS. 12A, 12B are sectional views in individual processes for explaining an example of a production method for producing a transfer sheet of the invention, FIGS. 13A to 13C are sectional views in individual processes for explaining an example of a production method of a wiring board of the invention by the use of a transfer sheet of the invention, FIG. 14 is a sectional view showing an example of a wiring board of the third embodiment of the invention, and FIG. 15 is a sectional view showing another example of the wiring board of the third embodiment of the invention. In these views, reference numeral 21 denotes a base, reference numeral 22 denotes a high-resistance metal layer, reference numeral 25 denotes an insulation layer, and reference numeral 26 denotes a resistor. A transfer sheet 23 of the invention is constituted mainly by the base 21 and the high-resistance metal layer 22, and a wiring board 7 of the invention is constituted mainly by the insulation layer 25 and the conductor circuit 26.

The base 21 that constitutes the transfer sheet 23 has a function as a base member for trimming the high-resistance metal layer 22 so as to have a desired resistance value and for transferring the high-resistance metal layer 22 onto the surface of the wiring board 27. A material used for the base 21 is the same as that for the base 1 of the aforementioned embodiment. In view of easily peeling off the base 21 from the surface of the wiring board 27, it is preferable to use a flexible resin film.

Further, it is appropriate that the thickness of the base 21 is 10 to 500 μm, and desirably, it is preferable that it is 20 to 300 μm in the same manner as those of the bases 1, 11 of the aforementioned embodiments. In a case where the thickness of the base 21 is less than 10 μm, there is a tendency to cause the base 21 to be deformed or bent and cause the high-resistance metal layer 22 formed on the surface to be apt to have a break. In a case where the thickness of the base 21 is more than 500 μm, the base 21 does not have flexibility, and it tends to become difficult to peel off the base 21 from the surface of the wiring board 27.

Furthermore, regarding the base 21, in order to prevent the base 21 from being damaged by the laser light 24 and the accuracy of position of the high-resistance metal layer 22 form being lowered at the time of trimming the high-resistance metal layer 22 by laser light 24 from a state shown in FIG. 12A to a state shown in FIG. 12B, it is preferable to set light-transmittance in a wavelength of the laser light 24 used for trimming to 0.6 or more, thereby making most of the laser light 24 transmit and preventing the base 21 from being damaged by the laser light 24.

In specific, in order to accurately trim so that the error of the resistance of the resistor 26 formed on the wiring board 27 is 10% or less, as the used laser light 24, it is preferable to use the laser light 24 having a short wavelength of 150 to 400 nm which further enables fine processing. In view of making the laser light 24 having a wavelength of 150 to 400 nm transmit, it is preferable to make the base 21 have light-transmittance in a wavelength in a range from 150 to 400 nm of 0.6 or more.

According to the transfer sheet 23 of the invention, since light-transmittance in a wavelength of 150 to 400 nm of the base 21 is set to 0.6 or more, when the high-resistance metal layer 22 is trimmed so as to have a desired resistance value by the laser light 24 having a short wavelength of 150 to 400 nm which is more excellent in fine processing, the base 21 can make most of the laser light 24 transmit without absorbing. Therefore, it is possible to form the resistor 26 without damaging the base 21 by the laser light 24, and consequently, it is possible to obtain the transfer sheet 23 that enables the base 21 to keep holding the high-resistance metal layer 22 processed into a desired shape with accuracy and that is appropriate for forming the high-resistance metal layer 22 that is excellent in accuracy of position.

As the base 21, in the same manner as the base 11 of the aforementioned embodiment, one having light-transmittance in a wavelength of 150 to 400 nm of 0.6 or more is used, and a transparent film as in the aforementioned embodiment is used.

Further, although it is important to the base 21 that at the time of trimming the high-resistance metal layer 22 by emitting the laser light 24 of 400 nm or less which is excellent in fine processing, the laser light 24 does not damage the base 21 when transmitting the base 11, it is difficult to perform fine processing of 50 μm or less with laser which has a wavelength more than 400 nm, and therefore, it tends to become difficult to accurately trim with error of 10% or less. In a case where light-transmittance in a wavelength of 150 to 400 nm of the base 21 is less than 0.6, there is a danger that the laser light 24 entering the base 21 damages the base 21, and consequently, the base 21 is distorted and the trimmed high-resistance metal layer 22 on the base 21 is displaced. Therefore, it is preferable that light-transmittance in a wavelength of 150 to 400 nm of the base 21 is 0.6 or more.

Furthermore, the transfer sheet 23 has the high-resistance metal layer 22 on the base 21. The high-resistance metal layer 22 is formed by metal of 20 μΩ·cm or more, and one kind or two or more kinds of metal and alloy from among, for example, copper, nickel, chromium, manganese, iron, silver, platinum, tin, aluminum, silicon, rhodium, iridium, ruthenium, rhenium, gold or the like is preferably used. In a case where the high-resistance metal layer 22 is less than 20 μΩ·cm, at the time of processing the high-resistance metal layer 22 into a pattern shape so as to have a desired resistance value, it is necessary to make the high-resistance metal layer 22 minute by making the width thereof small because of high conductivity, and consequently, the high-resistance metal layer 22 tends to be excessively trimmed when being trimmed by the laser light 24, or broken by a flexion of the transfer sheet 23 at the time of transferring the high-resistance metal layer 22 to the insulation layer 25. Therefore, the high-resistance metal layer 22 needs to be 20 μΩ·cm or more.

Further, it is appropriate that the thickness of the high-resistance metal layer 22 is 1 to 100 μm, and desirably, it is preferable that it is 5 to 50 μm. In a case where the thickness of the high-resistance metal layer 22 is less than 1 μm, the trimmed high-resistance metal layer 22 tends to be apt to have a break, and in a case where more than 100 μm, the burying amount of the trimmed high-resistance metal layer 22 into the insulation layer 25 becomes large when the trimmed high-resistance metal layer 22 is transferred on the insulation layer 25, so that there is a tendency to cause the insulation layer 25 to be largely distorted and cause the wiring board 27 to be apt to be deformed.

The high-resistance metal layer 22 can be formed into a desired pattern shape by forming metal foil formed by rolling or a metal thin film formed by a well-known method such as plating, spattering, vacuum deposition, ion-plating, baking of conductive paste or forming of a conductive resin film on the base 21 and then performing well-known etching treatment. The high-resistance metal layer 22 and the base 21 may be adhered by a well-known adhesive of acrylic, rubber, silicon, epoxy or the like, and it is appropriate that the thickness thereof is 1 to 20 μm although depending on an adhesion force. Moreover, the high-resistance metal layer may be formed into a pattern by a method of forming a resist on the base 21 and forming a pattern shape by plating, or a method of printing conductive paste into a pattern shape by screen printing or the like.

Further, in the transfer sheet 23 of the invention, at least part of the high-resistance metal layer 22 is removed by laser-processing. This is also important in the invention.

According to the transfer sheet 23 of the invention, since the high-resistance metal layer 22 of 20 μΩ·cm or more is disposed on the base 21 and at least part of the high-resistance metal layer 22 is removed by laser-processing, it is possible to accurately process the high-resistance metal layer 22 by laser-processing so as to have a desired resistance value, and by transferring the high-resistance metal layer 22 onto the insulation layer 25, it is possible to form the resistor 26 having a highly accurate resistance value without damaging the insulation layer 25 by the laser light 24.

Laser used for processing the high-resistance metal layer 22 is laser such as YAG laser, excimer laser, copper vapor laser or carbon dioxide laser. By emitting such laser onto the high-resistance metal layer 22 from the side of the high-resistance metal layer 22 and removing the high-resistance metal layer 22, it is possible to form the high-resistance metal layer 22 having a desired resistance value. In view of having favorable processibility and favorable fine processibility to the high-resistance metal layer 22 and forming the resistor 26 with error of 10% or less, it is preferable to use laser which has a wavelength in the ultraviolet region such as third harmonic YAG laser, fourth harmonic YAG laser, excimer laser or second harmonic copper vapor laser.

In the case of processing the high-resistance metal layer 22 by laser, the rim of the trimmed high-resistance metal layer 22 is featured by part of the high-resistance metal layer 22 processed by laser being fused and deformed by thermal fusion.

Further, in the transfer sheet 23 of the invention, it is preferable that the rim of the high-resistance metal layer 22 processed by laser has a protruding portion 22a which protrudes to the opposite side to the base 21 as shown in the sectional view of the transfer sheet 23 in FIG. 11.

According to the transfer sheet 23 of the invention, since the rim of the high-resistance metal layer 22 formed by laser-processing is made to protrude to the opposite side to the base 21, it is possible to obtain a large anchor effect by burying and fixing the protruding portion into the insulation layer 25 at the time of transferring the high-resistance metal layer 22 of the transfer sheet 23 onto the insulation layer 25. Therefore, it is possible to stably transfer the high-resistance metal layer 22 onto the insulation layer 25 without causing a transfer failure.

Regarding the protruding portion 22a, in view of burying into the insulation layer 3 to increase the adhesion to the insulation layer 25 by an anchor effect and decrease a transfer failure, it is preferable to set the height of the protruding portion 22a to 1 $\mu$m or more. Moreover, in view of making it hard to cause distortion of the insulation layer 25 due to large deformation of the insulation layer 25 at the time of transferring the high-resistance resistance metal layer 22 onto the insulation layer 25, it is preferable to set to 20 $\mu$m or less.

The protruding portion 22a can be formed by thermal deformation of the rim of the high-resistance metal layer 22 processed by laser by controlling laser conditions at the time of laser-processing, and can be formed so as to have a desired height by, for example, controlling laser conditions such as laser energy, laser pulse frequency, laser pulse width and the number of emissions.

Further, in order to increase the adhesion of the high-resistance metal layer 22 to the insulation layer 25 described later, it is preferable to rough the surface thereof by treatment such as buffing, blasting, brushing, plasma treatment, corona treatment, ultraviolet treatment or chemical treatment.

Next, the wiring board 27 of the invention will be described based on FIGS. 13A to 13C. In these views, reference numeral 25a denotes a precursor sheet to become the insulation layer 25.

The insulation layer 25 has a function as a base of the resistor 26, a wiring conductor 28 and electronic components (not shown in the views), and is made of the same material as the insulation layers 3, 13 of the aforementioned embodiments.

The precursor sheet 25a becomes the insulation layer 25 that constitutes the wiring board 27 to be produced finally, by hardening in the process of heating and hardening in the case of using a thermosetting resin, and by sintering in the baking process in the case of using a ceramic green sheet.

Further, by setting the porosity of the precursor sheet 25a in a dry state to 3 to 40% by volume, at the time of transferring the high-resistance metal layer 22 and burying into the precursor sheet 25a, it is possible to prevent a rise of the precursor sheet 25a around the high-resistance metal layer 22 and flatten, and it is possible to facilitate discharge of air existing between the high-resistance metal layer 22 and the precursor sheet 25a and prevent entrainment of air bubbles. In a case where the porosity in the dry state is more than 40% by volume, there is a possibility that after laminating a plurality of precursor sheets 25a and pressurizing, heating and hardening, air holes are left in the precursor sheets 25a, the air holes absorb moisture in the air, and the insulation performance decreases. Therefore, it is preferable to set the porosity of the precursor sheet 25a in the dry state in the range of 3 to 40% by volume.

It is possible to set the porosity of the precursor sheet 25a in the dry state to a desired value in the same manner as that of the precursor sheets 3a, 13a of the aforementioned embodiments.

Further, in a case where the precursor sheet 25a is made of a thermosetting resin or a thermoplastic resin, in order to control a thermal expansion coefficient of the insulation layer 25, and in order to increase mechanical strength, it is preferable to use a material treated in the same manner as those of the precursor sheets 3a, 13a of the aforementioned embodiments. Particularly, in view of obtaining a favorable high-frequency transmission performance, and in view of favorably forming the minute through conductor 29 having a diameter of 100 $\mu$m or less, it is preferable to use a precursor sheet made by coating the upper and lower faces of a liquid crystal polymer film with organic resin adhesion layers. More specifically, it is preferable that the precursor sheet 25a to become the insulation layer 25 includes a liquid crystal polymer film and organic resin adhesion layers which coat both faces of the liquid crystal polymer film opposed to each other as in the aforementioned embodiments.

The precursor sheet 25a is produced by the same method as the precursor sheets 3a, 13a of the aforementioned embodiments in a case where the precursor sheet 25a is made by, for example, coating the upper and lower faces of a heat-resistance film of liquid crystal polymer or the like with organic resin adhesion layers of an epoxy resin, thermosetting polyphenylene other or the like.

Next, on the surface of the precursor sheet 25a, the wiring conductor 28 is to formed. The wiring conductor 28 can be formed by, for example, transferring a circuit pattern formed by etching metal foil made of low-resistance metal such as gold, silver, copper, aluminum or alloy thereof on the surface of the precursor sheet 25a. The wiring conductor 28 may be formed after the high resistance metal layer 22 described later is formed on the precursor sheet 25a.

Next, after the transfer sheet 23 of the invention and the precursor sheet 25a are registered as shown by the sectional view in FIG. 13A, they are laminated as shown by the sectional view in FIG. 13B, and a pressure of approximately 1 to 50 MPa is applied. At this moment, in order to increase the adhesion of the high-resistance metal layer 22 and the precursor sheet 25a, they may be warmed at 100 to 200° C. By using a thermoplastic resin to be softened by heat, a thermosetting resin of half-set state or a ceramic green sheet as the precursor sheet 25a, it is possible to bury the high-resistance metal layer 22 into the precursor sheet 25a by a mechanical pressure.

Then, as shown by the sectional view in FIG. 13C, by peeling off the base 21, or by removing the base 21 by a method such as etching, the high-resistance metal layer 22 is transferred to the precursor sheet 25a, and finally heated and hardened, whereby the wiring board 27 can be produced.

According to the wiring board 27 of the invention, since the wiring board is constituted by forming the resistor 26 by transferring the high-resistance metal layer 22 of the transfer sheet 23 of the above construction onto the surface of the insulation layer 25, it is possible to form the resistor 26 having a highly accurate resistance value without damaging the insulation layer 25, and consequently, it is possible to obtain the wiring board 27 that is excellent in insulation performance and accuracy of a resistance value.

Further, according to a production method of a wiring board of the invention, since the method comprises the step of overlaying a face of the side of the high-resistance metal layer 22 of the transfer sheet 23 of the above construction on the surface of the insulation layer 25, the step of pressure-contacting the transfer sheet 23 and the insulation layer 25, and the step of removing the base 21 of the transfer sheet 23 to transfer the high-resistance metal layer 22 onto the insulation layer 25, whereby forming the resistor 26, it is possible to easily form the resistor 26 having a highly accurate resistance value on the insulation layer 25 without damaging the insulation layer 25. Besides, since the resistor 26 is buried into the insulation layer 25 by a pressure applied at the time of transferring the high-resistance metal layer 22 and forming the resistor 26, the adhesion of the resistor 26 to the insulation layer 5 is excellent.

As shown by the sectional view in FIG. 14, a wiring board of the invention may be a wiring board 27a which has the resistors 26 formed by the use of the transfer sheets 23 of the invention on both the upper and lower faces of the insulation layer 25. Furthermore, it is also possible to electrically connect the wiring conductors 28 and/or the resistors 26 on the upper and lower faces via the through conductors 29 formed in the insulation layer 25. Still further, as shown by the sectional view in FIG. 15, a wiring conductor 27b may be formed by laminating the insulation layers 25 having the resistors 26 formed by the use of the transfer sheets 23 of the invention so as to be multilayered.

The through conductor 29 has a diameter of approximately 20 to 150 μm, has a function of electrically connecting the wiring conductors 28 and/or the resistors 26 located vertically on both sides of the insulation layer 25, and is formed in the same manner as the through conductors 9, 19 of the aforementioned embodiments.

A wiring board of the invention is not confined within the above embodiment, various changes are allowed in a range without deviating from the scope of the invention, and, for example, although the wiring boards 27, 27a, 27b described in the above embodiment are formed by one insulation layer 25 or by laminating three insulation layers 25, the wiring boards 27, 27a, 27b may be produced by laminating two or four or more insulation layers 25. Moreover, a wiring board may be produced by laminating one or two or more insulation layers 25 on which the resistors 26 are formed by the use of the transfer sheets 23 of the invention on the surface of a well-known core board. Furthermore, solder resists may be formed on the surfaces of the wiring board 27, 27a, 27b of the invention.

EXAMPLE

Next, a transfer sheet and a wiring board of the invention were evaluated by producing the following samples.

Example 5

Onto the substantially full faces of bases made of polyethylene terephthalate having a thickness of 100 μm, an adhesive made of an acrylic resin was applied to give adhesion, and high-resistance metal foil made of alloy of nickel and copper having various resistivity, thickness of 12 μm and surface roughness Ra (arithmetic average roughness) of 0.8 μm was adhered thereon. Then, after a photo resist was applied and exposure development was performed, they were immersed into an etching agent, and non-pattern portions were removed by etching, whereby circuit patterns were formed. Furthermore, by emitting third harmonic YAG laser to part of the patterns and trimming so as to be 50Ω while measuring resistance of these patterns, transfer sheets were produced.

The result of observation of resistance values of the trimmed high-resistance metal layers of the obtained transfer sheets is shown in Table 2. Measurement of the resistance values was performed on 20 sheets for each sample in order to derive the degree of variations of the resistance values. It was represented by ○ that variations of the resistance values were within ±3%, and others were represented by X.

TABLE 2

| sample No. | resistivity/ μΩ · cm | variations of resistance values/% | good or bad |
|---|---|---|---|
| 9* | 10 | ±4.0 | x |
| 10* | 15 | ±3.8 | x |
| 11* | 19 | ±3.2 | x |
| 12 | 20 | ±2.9 | ○ |
| 13 | 25 | ±2.5 | ○ |
| 14 | 40 | ±1.9 | ○ |

A sample marked with an asterisk is beyond the scope of the invention.

It was found from Table 2 that since a sample whose resistivity was less than 20 μΩ·cm (sample Nos. 9 to 11) needs a minute resistor pattern in order to obtain a desired resistance value, it was difficult to control laser and variations of resistance values did not fall within 13% whereas a sample whose resistivity was 20 μΩ·cm or more (sample Nos. 12 to 14) was excellent and variations of resistance values tell within ±3%.

Further, by registering and adhering these transfer sheets (sample Nos. 12 to 14) insulation films having a thickness of 100 μm made of glass woven fabric immersed into an epoxy resin, peeling off bases to form resistors having a resistance value of 50Ω, and finally processing by heat for one hour at a temperature of 200° C. under a pressure of 3 MPa to completely harden, a wiring board was produced, it was confirmed that a resistor having a resistance value of 50Ω could be formed on a wiring board in a favorable manner. Furthermore, a high temperature bias test with applied voltage of 5.5 V was carried out on these wiring boards at a temperature of 130° C. and at 85% relative humidity, with the result that it was confirmed that an insulation failure did not occur after 168 hours.

Example 6

After polycarbonate dissolved in methylene chloride was formed into sheets, polycarbonate bases having a thickness of 100 μm and various transmittances were produced by controlling a drying speed by changing a drying temperature, an adhesive made of an acrylic resin was applied to the substantially full faces of the bases to make them have adhesion, and high-resistance metal foil made of alloy of nickel and copper having resistivity of 40 μΩ·cm thickness of 12 μm and surface roughness Ra (arithmetic average roughness) of 0.8 μm was adhered, whereby transfer sheets were produced. Then, patterns were formed in the same manner as in example 5. Furthermore, by emitting third harmonic YAG laser having a wavelength of 355 nm or second harmonic copper vapor laser having a wavelength of 255 nm to part of the patterns while measuring resistances of the patterns, and trimming so as to be 100Ω, transfer sheets were produced.

Next, insulation films made by forming thermosetting polyphenylene ether resin coating layers having a thickness of 20 μm on the upper and lower faces of liquid crystal polymer films having a thickness or 50 μm were prepared, through holes were formed thereon by laser, and thereafter, these through holes were filled with conductive paste, whereby through conductors were formed. Then, by registering and adhering the transfer sheets, peeling off the bases to form resistors made by high-resistance metal layers, and finally processing by heat for one hour at a temperature of 200° C. under a pressure of 3 MPa to completely harden, wiring boards were produced.

The result of observation of the accuracy of position of the resistors of the obtained transfer sheets is shown in Table 3. In this table, regarding whether the evaluation of the accuracy of position was good or bad, it was represented by ◯ that the resistors were transferred on the through conductors with accuracy of position, and it was represented by X that the resistors and the through conductors were deviated from each other.

TABLE 3

| sample No. | wavelength of used laser/nm | light-transmittance of base in wavelength of used laser | accuracy of position |
| --- | --- | --- | --- |
| 15* | 355 | 0.3 | x |
| 16* | 355 | 0.5 | x |
| 17 | 355 | 0.6 | ◯ |
| 18 | 355 | 0.8 | ◯ |
| 19* | 255 | 0.3 | x |
| 20* | 255 | 0.5 | x |
| 21 | 255 | 0.6 | ◯ |
| 22 | 255 | 0.8 | ◯ |

A sample marked with an asterisk is beyond the scope of the invention.

It was found from Table 3 that in a sample whose light transmittance in a wavelength of 150 to 400 nm was less than 0.6, the high-resistance metal layer was displaced because the base of the transfer sheet was damaged by laser, and consequently, the transferred resistor was displaced, whereas a transfer sheet of the invention whose light-transmittance in a wavelength of 150 to 400 nm was 0.6 or more was excellent, and the accuracy of position of the transferred resistor was favorable.

Example 7

Transfer sheets were produced in the same manner as in example 5, except trimming while controlling the strength of third harmonic YAG laser and making the rims of pattern parts of high resistance metal layers protrude. Next, by registering and adhering the transfer sheets onto insulation films made by forming thermosetting polyphenylene ether resin coating layers having a thickness of 20 μm on upper and lower faces of liquid crystal polymer films having a thickness of 50 μm and polyimide films having a thickness of 100 μm, peeling off bases to form resistors having a resistance value of 50 106 , and finally processing by heat for one hour at a temperature of 200° C. under a pressure of 3 MPa to completely harden, wiring boards were produced.

There were three kinds to protrusion heights of the rims of the patterns processed by laser, which were 0 μm, 5 μm and 10 μm.

As a result of observation of resistors of the obtained wiring boards, regarding a wiring board using an insulation film made by forming polyphenylene ether resin coating layers on the upper and lower faces of a liquid crystal polymer film, it was found that a pattern was favorably transferred and a resistor was favorably formed in the case of any protrusion height of the pattern rim processed by laser. However, regarding a wiring board using a polyimide film, in a case where the protrusion height of the pattern rim processed by laser was 0 μm, a transfer failure of the pattern was caused, and a resistor was not formed. On the other hand, it was found that wiring boards using polyimide resin films having protrusion heights of 5 μm and 10 μm were excellent, and favorable resistors were formed.

(Fourth Embodiment)

In the case of directly processing a metal layer of a transfer sheet by laser as in the aforementioned embodiments, the rim of a part processed by laser is fused and deformed because of heat generated at the time of laser-processing. Particularly, in the case of forming a minute circuit pattern which is 30 μm or less in width and pitch, it is largely fused and deformed, and irregularity on the surface of the circuit pattern tends to become large. Then, in the case of using a wiring board produced by the use of a transfer sheet on which a minute circuit pattern is formed by laser-processing in a high-frequency region of 100 MHz or more, a transmission characteristic is low because of irregularity of the surface of a conductor circuit. This embodiment was made in order to solve such a problem.

Figure 16A:
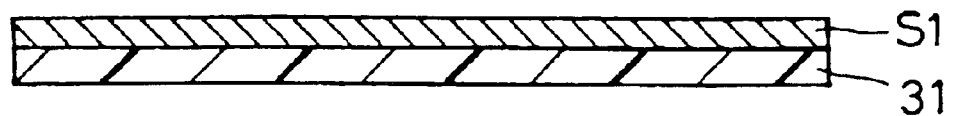
FIGS. 16A to 16C are sectional views in individual processes for explaining an example of a production method for producing a transfer sheet of a fourth embodiment of the invention.
Figure 16B:
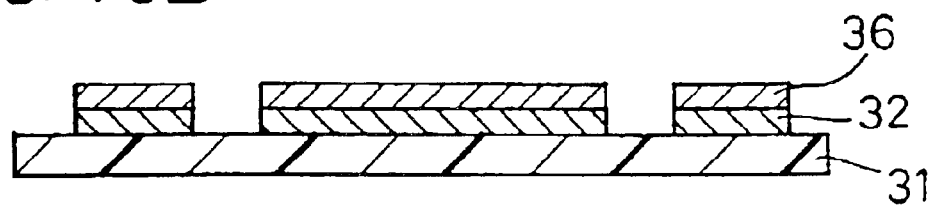
Figure 16C:
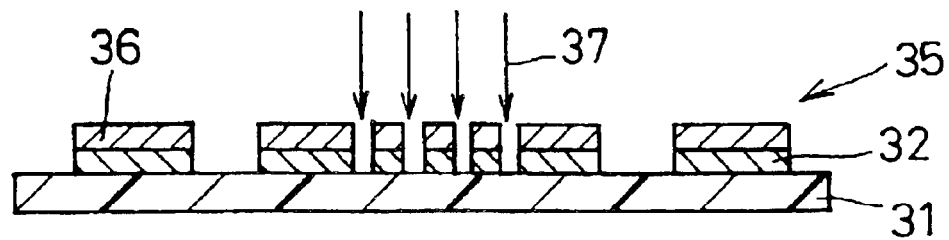
Figure 17A:
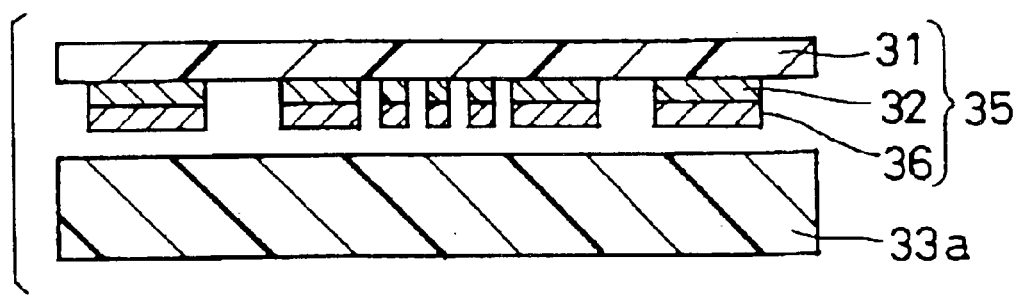
FIGS. 17A to 17C are sectional views in individual processes for explaining an example of a production method for producing a wiring board of the invention by the use of a transfer sheet of the invention.
Figure 17B:
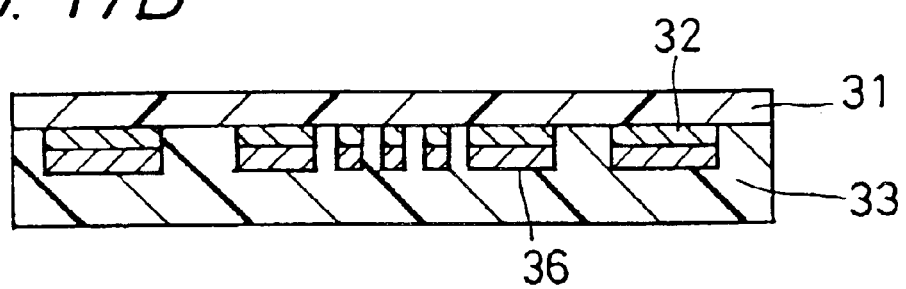
Figure 17C:
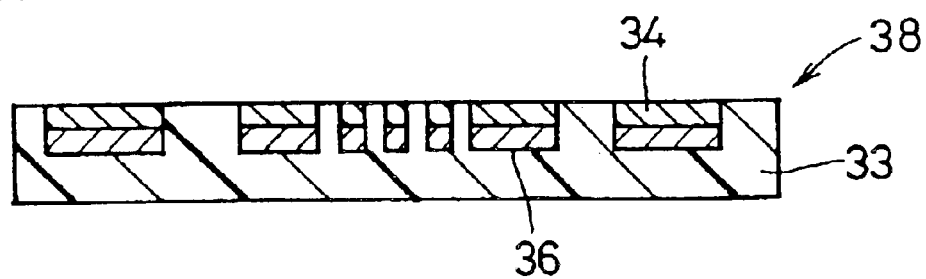
Figure 18A:
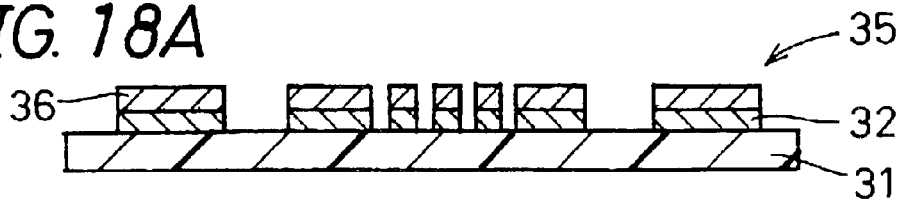
FIGS. 18A to 18E are sectional views in individual processes for explaining an example of another production method for producing a wiring board of the invention by the use of a transfer sheet of the invention.
Figure 18B:
Figure 18C:
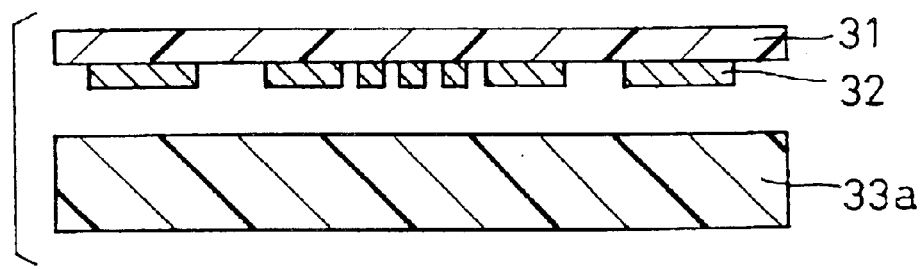
Figure 18D:
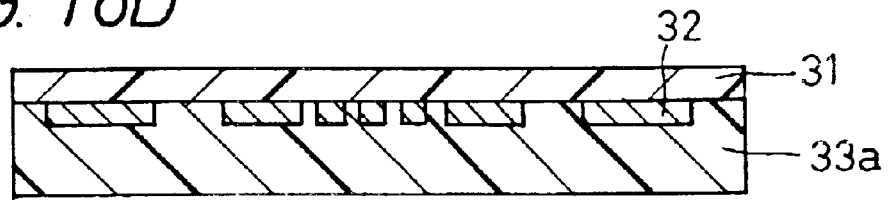
Figure 18E:
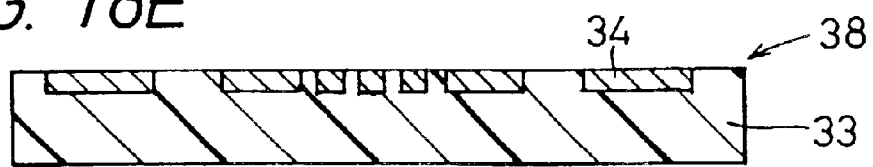
Figure 19:
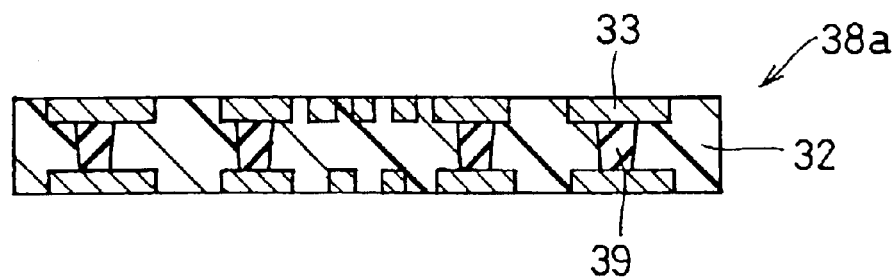
FIG. 19 is a sectional view showing an example of a wiring board of the fourth embodiment of the invention.
Figure 20:
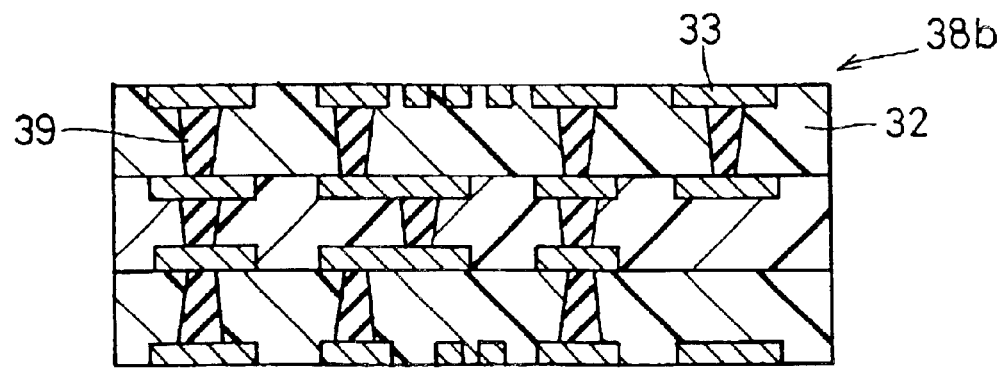
FIG. 20 is a sectional view showing another example of the wiring board of the fourth embodiment of the invention.

FIGS. 16A to 16C are sectional views in individual processes for explaining an example of a production method for producing a transfer sheet of a fourth embodiment of the invention, FIGS. 17A to 17C are sectional views in individual processes for explaining an example of a production method for producing a wiring board of the invention by the use of a transfer sheet of the invention, FIGS. 18A to 18E are sectional views in individual processes for explaining an example of another production method for producing a wiring board of the invention by the use of a transfer sheet of the invention, FIG. 19 is a sectional view showing an example of a wiring board of the fourth embodiment of the invention, and FIG. 20 is a sectional view showing another example of the wiring board of the fourth embodiment of the invention.

In these views, reference numeral 31 denotes a base, reference symbol S1 denotes a metal layer, reference numeral 32 denotes a metal layer formed into a circuit pattern, reference numeral 33 denotes an insulation layer, reference numeral 34 denotes a conductor circuit, and reference numeral 36 denotes an organic resin film. A transfer sheet 35 of the invention is constituted mainly by the base 31, the metal layer 32 formed into a circuit pattern and the organic resin film 36, and a wiring board 38 of the invention is constituted mainly by the insulation layer 33 and the conductor circuit 34.

The base 31 that constitutes the transfer sheet 35 has a function as a base member for processing the metal layer S1 into a circuit pattern and for transferring the metal layer 32 formed into a circuit pattern onto the surface of the insulation layer 33. A used material for the base 31 is the same as that for the base 21 of the aforementioned embodiment. In view of easily peeling off the base 31 from the surface of the wiring board 38, it is preferable to use a flexible resin film.

Further, it is appropriate that the thickness of the base 31 is 10 to 500 μm, and desirably, it is preferable that it is 20 to 300 μm in the same manner as those of the bases 1, 11 of the aforementioned embodiments.

Furthermore, regarding the base 31, in order to prevent that the base 31 is distorted by a damage of the base 31 by the laser light 37 and the accuracy of position of the metal layer 32 is lowered at the time of fine processing of the metal layer 32 by laser light 37, as in the bases 11, 21 of the aforementioned embodiments, it is preferable to set light-transmittance in a wavelength of the laser light 37 used for fine processing of the metal layer 32 to 0.6 or more and make most of the laser light 37 transmit to prevent the base 31 from being damaged by the laser light 37.

In specific, in order to make the conductor circuit 34 formed on the wiring board 38 minute one of 50 μm, as the used laser light 37, it is preferable to use the laser light 37 having a short wavelength of 150 to 400 nm which further enables fine processing, and in view of making the laser light 37 having a wavelength of 150 to 400 nm transmit, it is preferable that the base 31 has light-transmittance in a wavelength in a range from 150 to 400 nm of 0.6 or more. In a case where light-transmittance in a wavelength of 150 to 400 nm of the base 31 is less than 0.6, there is a danger that the laser light 37 entering the base 31 damages the base 31, and consequently, the base 31 is distorted and the metal layer 2 on the base 31 is displaced. Therefore, it is preferable that light-transmittance in a wavelength of 150 to 400 nm of the base 37 is 0.6 or more.

As the base 31, in the same manner as the base 11 of the aforementioned embodiment, one whose light-transmittance in a wavelength of 150 to 400 nm is 0.6 or more is used, and a transparent film as in the aforementioned embodiments is used.

Furthermore, on the base 31, the metal layer 32 like the metal layer 2 of the aforementioned embodiment formed into a circuit pattern is disposed.

The metal layer 31 to become the metal layer 32 is formed in the same manner as the metal layer S of the aforementioned embodiments. Moreover, the metal layer 32 and the base 31 may be adhered by a well-known adhesive of acrylic, rubber, silicon, epoxy or the like, and it is appropriate that the thickness thereof is 1 to 20 μm although depending on an adhesion force.

Further, in the transfer sheet 35 of the invention, on the upper face of the metal layer 32, the organic resin film 36 having light-transmittance in a wavelength of 150 to 400 nm of 0.4 or less is formed. This is important in the invention.

According to the transfer sheet 35 of the invention, since the organic resin film 36 having light-transmittance in a wavelength of 150 to 400 nm of 0.4 or less is formed on the upper face of the metal layer 32, when the laser light 37 having a minute beam diameter is emitted from the side of the organic resin film 36, the organic resin film 36 favorably absorbs the laser light 37, whereby a part of the organic resin film 36 irradiated with the laser light 37 is efficiently dissolved and favorably removed, and a part of the organic resin film 36 not irradiated with the laser light 37 protects the metal layer 2. Therefore, it is possible to effectively prevent fusion deformation of the metal layer 32 due to heat generated by the laser light 37 and form the minute-circuit pattern-shaped metal layer 32 without impairing the flatness of the surface of the metal layer 32. As a result, it is possible to form the minute conductor circuit 34 that is excellent in high-frequency transmission characteristic.

As the organic resin film 36 having light-transmittance in a wavelength of 150 to 400 nm of 0.4 or less, for example, a thermosetting resin such as an epoxy resin, a bismaleimide triazine resin, a thermosetting polyphenylene ether resin or a phenol resin, a thermoplastic resin such as a polyimide resin, a fluorocarbon resin, a polyphenylene ether resin, a liquid crystal polymer resin, an aramid resin or polyethylene terephthalate, or a material made by mixing pigment, colorant, dye and the like into them is used.

In a case where light-transmittance in a wavelength of 150 to 400 nm of the organic resin film 36 is more than 0.4, when the laser light 37 having a short wavelength of 150 to 400 nm which is excellent in fine processing is emitted and unnecessary parts of the organic resin film 36 and the metal layer 32 are removed, the laser light 37 transmits without being absorbed by the organic resin film 36, and the metal layer 32 is processed by laser as the organic resin film 36 is not favorably processed by laser. Thus, gaseous dissolution of the metal layer 32 peels off the organic resin film 36 from the metal layer 32, with the result that an effect of the organic resin film 36 of preventing fusion deformation of the surface of the metal layer 32 is lost, and smoothness of the surface of the metal layer 32 tends to be impaired. Therefore, it is important that light-transmittance in a wavelength of 150 to 400 nm of the organic resin film 36 is 0.4 or less.

In a case where the wavelength of the laser light 37 used at the time of removing unnecessary parts of the organic resin film 36 and the metal layer 32 is more than 400 nm, it is difficult to make the focal point of the laser light 37 minute, and it tends to become difficult to form a minute conductor circuit which is 50 μm or less in width and pitch, and in a case where less than 150 nm, it tends to become difficult to form the laser light 37 of short-wavelength. Therefore, it is necessary to use the laser light 37 having a wavelength of 150 to 400 nm for fine processing of the metal layer 32, and in view of laser-processibility of the organic resin film 36, it is important that light-transmittance in a wavelength of 150 to 400 nm of the organic resin film 36 is 0.4 or less.

Further, in the transfer sheet 35 of the invention, the metal layer 32 is formed into a circuit pattern, and it is preferable that at least part of the circuit pattern is formed by laser-processing.

According to the transfer sheet 35 of the invention, since at least part of the circuit pattern of the metal layer 32 is formed by laser-processing, it is possible, without using an etching process or a plating process in which it is considerably difficult to control the speed of etching or the speed of plating deposition, to remove the metal layer 32 by emitting laser light having a minute beam diameter. Therefore, it is prevented that the conductor circuit 34 has a break because of excessive etching or a failure of plating deposition or the conductor circuit 34 is short-circuited because of the residue of etching or a short of plating.

The laser-processing for forming at least part of the circuit pattern of the metal layer 32 is performed by emitting the laser light 37 such as YAG laser, excimer laser, copper vapor laser or carbon dioxide laser onto the organic resin film 36 to become an unnecessary part from the side of the organic resin film 36, and removing the organic resin film 36 and the metal layer 32. In view of having favorable processibility to the metal layer 32 and easily forming the conductor circuit 34 having a minute width and pitch of 50 μm or less, it is desirable to use laser having a wavelength in the ultraviolet region such as third harmonic YAG laser, fourth harmonic YAG laser, excimer laser or second harmonic copper vapor laser.

Although the metal layer 32 formed into a circuit pattern may be entirely formed by laser-processing, in view of shortening a processing time, as shown in FIGS. 16A to 16C, it may be formed by using a method of forming the metal layer 32 other than a minute part by a well-known photo lithography method and then forming only the minute part by laser-processing. Further, the production method to be used is a method of: firstly forming the metal foil 32 on the base 31 as shown in FIG. 16A; and then, after forcing the organic resin film 36 provided with photo sensitivity on the surface of the metal layer 32 and forming the organic resin film 36 into a pattern by the well-known photo lithography method, removing the exposed metal layer 32 to form the metal layer 32 into a circuit pattern as shown in FIG. 16B; and further, processing a minute part by the laser light 37 as shown in FIG. 16C.

Next, the wiring board 38 of the invention will be described based on FIGS. 17A to 17C. In FIGS. 17A to 17C, reference numeral 33a denotes a precursor sheet to become the insulation layer 33.

The insulation layer 33 has a function as a base of the conductor circuit 4 or electronic components (not shown in the views) mounted on the wiring board 38, and the material thereof is the same as these of the insulation layers 3, 13, 25 of the aforementioned embodiments.

The precursor sheet 33a becomes the insulation layer 33 that constitutes the wiring board 38 to be produced finally, by hardening in the process of heating and hardening in the case of using a thermosetting resin, and by sintering in the baking process in the case of using a ceramic green sheet.

It is preferable that the porosity of the precursor sheet 33a in a dry state is set to 3 to 40% by volume as those of the precursor sheets 3a, 13a, 25a of the aforementioned embodiments.

The porosity of the precursor sheet 33a in the dry state can be set to a desired value in the same manner as those of the precursor sheets 3a, 13a 25a of the aforementioned embodiments.

Further, in a case where the precursor sheet 33a is made of a thermosetting resin or a thermoplastic resin, in order to control a thermal expansion coefficient of the insulation layer 33, and in order to increase mechanical strength, it is preferable to use a material treated in the same manner as these of the precursor sheets 3a, 13a, 25a of the aforementioned embodiments. Particularly, in view of obtain a favorable high-frequency transmission performance, and in view of favorably forming the minute through conductor 39 having a diameter of 100 μm or less mentioned later, it is preferable to use a precursor sheet made by coating the upper and lower faces of a liquid crystal polymer film with organic resin adhesion layers. More specifically, it as preferable that the precursor sheet 33a to become the insulation layer 33 includes a liquid crystal polymer film and organic resin adhesion layers which coat both faces of the liquid crystal polymer film opposed to each other as in the aforementioned embodiments.

The precursor sheet 33a is produced by the same method as the precursor sheets 3a, 13a, 25a of the aforementioned embodiments in a case where the precursor sheet 33a is made by, for example, coating the upper and lower faces of a heat-resistant film of liquid crystal polymer or the like with organic resin adhesion layers of an epoxy rein, thermosetting polyphenylene ether or the like.

Next, in a production method of the wiring board 38, firstly, the transfer sheet 35 of the invention and the precursor sheet 33a are registered as shown by the sectional view in FIG. 17A and thereafter laminated as shown by the sectional view in FIG. 17B, and a pressure of approximately 1 to 50 MPa is applied. At this moment, in order to increase the adhesion of the organic resin film 36 and the insulation sheet 33, they may be warmed at 100 to 200° C. By using a thermoplastic resin to be softened by heat, a thermosetting resin of half-set state or a ceramic green sheet as the precursor sheet 33a, it is possible to bury the metal layer 32 and the organic resin film 36 into the insulation layer 33 by a mechanical pressure.

Then, as shown by the sectional view in FIG. 17C, by peeling off the base 31, or by removing the base 31 by a method such as etching, the metal layer 32 and the organic resin film 36 are transferred to the precursor sheet 33a, and finally heated and hardened, whereby the wiring board 38 having the conductor circuit 34 can be produced.

Further, another example of a production method of the wiring board 38 will be described based on FIGS. 18A to 18E. Firstly, by removing the organic resin film 36 from the transfer sheet 35 of the invention shown by the sectional view in FIG. 18A by a method of dissolving by an agent, peeling off or the like, a transfer sheet constituted by the base 31 and the circuit-shaped metal layer 32 as shown by the sectional view in FIG. 18B is obtained. Next, after the metal layer 32 and the precursor 33 are registered as shown by the sectional view in FIG. 18C, they are laminated as shown by the sectional view in FIG. 18D, and a pressure of approximately 1 to 50MPa is applied. At this moment, in order to increase the adhesion of the metal layer 32 and the precursor sheet 33a, they may be warmed at 100 to 200° C. By using a thermoplastic resin to be softened by heat, a thermosetting resin of half-set state or a ceramic green sheet as the precursor sheet 33a, it is possible to bury the metal layer 32 into the insulation layer 33 by a mechanical pressure.

Then, as shown by the sectional view in FIG. 18E, by peeling off the base 31, or by removing the base 31 by a method such as etching, the metal layer 32 is transferred to the precursor sheet 33a, and finally heated and hardened, whereby the wiring board 38 having the conductor circuit 34 can be produced.

In order to increase the adhesion of the metal layer 32 to the insulation layer 33 or to the organic resin film 36, it is preferable to rough the surface thereof by treatment such as buffing, blasting, brushing, plasma treatment, corona treatment, ultraviolet treatment or chemical treatment.

Further, as shown by the sectional view in FIG. 19, a wiring board of the invention may be a wiring board 38a which has the conductor circuits 34 formed by the use of the transfer sheets 35 of the invention on both the upper and lower faces of the insulation layer 33. Furthermore, it is also possible to electrically connect the conductor circuits 34 on the upper and lower faces via the through conductors 39 formed in the insulation layer 33. Still further, as shown by the sectional view in FIG. 20, a wiring board 38b may be formed by multilayering the insulation layers 33 having the conductor circuits 34 formed by the use of the transfer sheets 35 of the invention.

The through conductor 39 has a diameter of approximately 20 to 150 μm, has a function of electrically connecting the conductor circuits 34 located vertically on both sides of the insulation layer 33, and is formed by applying a puncturing process by laser to form a through hole on the insulation layer 33, burying conductive paste made of copper, silver, gold, solder or the like into the through hole by a well-known screen printing method, and, while transferring the metal layer 32 by the use of the transfer sheet 35, electrically connecting the metal layer 32 and the through conductor 39.

A wiring board of the invention is not confined within the above embodiment, various changes are allowed in a range without deviating from the scope of the invention, and for example, although the wiring boards 38, 38a, 38b described in the above embodiment are formed by one insulation layer 33 or by laminating three insulation layers 33 to be multilayered, a wiring board may be produced by laminating two or four or more insulation layers 33 to be multilayered. Moreover, a wiring board may be produced by laminating one or two or more insulation layers 33 on which the conductor circuits 34 are formed by the use of the transfer sheets 35 of the invention on the surface of a well-known core board. Furthermore, solder resists may be formed on the surfaces of the wiring board 38, 38a, 38b of the invention.

EXAMPLE

Next, a transfer sheet and a wiring board of the invention were evaluated by producing the following samples.

Example 8

An adhesive made of an acrylic resin was applied on the full faces of bases made of polyethylene terephthalate having a thickness of 100 μm so that the faces had adhesion, and copper foil having a thickness of 12 μm and surface roughness Ra (arithmetic average roughness) at 0.1 μm was adhered thereon. Then, after organic rein films made of a photosensitive acrylic resin into which 2-(2H-benzotriatole-2-i1)-4-6 bis(1-methyl-1-phenyl ethyl) phenol was added and whose transmittance in a wavelength of 355 nm was regulated to various values were applied and exposure development was performed, they were immersed into an iron chloride solution and non-pattern portions were removed by etching, whereby circuit patterns with the organic resin films attached on the upper faces were formed. The circuit pattern at this moment was relatively rough and the pattern width and pattern pitch thereof were more than 50 μm. Besides, by irradiating part of the circuit patterns with third harmonic YAG laser having a wavelength of 355 nm from the sides of the organic resin films, and removing the organic resin films and the copper foil, minute circuit patterns having a pattern width and pattern pitch of 50 μm or less were formed, whereby transfer sheets were produced.

Further, by registering and adhering the transfer sheets onto insulation films having a thickness of 100 μm made by forming adhesive layers made of thermosetting polyphenylene ether on the upper and lower faces of liquid crystal polymer films and then peeling off the bases, conductor circuits were formed, and thereafter, by laminating and processing by heat for one hour at a temperature of 200° C. under a pressure of 3 MPa to completely harden, wiring boards were produced.

The minute circuit pattern part included five parallel circuit patterns whose pattern width and pattern pitch were equally 15 μm and length was 1 cm, and regarding the transfer sheet, the surface roughness Ra (arithmetic average roughness) of the minute circuit pattern part was measured, whereby the smoothness thereof was evaluated. Moreover, regarding the wiring board, a strip-line-structure of wiring conductor was formed inside the multilayered wiring board, whereby the high-frequency transmission characteristic was evaluated.

The result of evaluation of the obtained transfer sheets and the wiring boards are shown in Table 4.

TABLE 4

| sample No. | light-transmittance of organic resin film in 355 nm | surface roughness of pattern/ μm | transmission characteristic | | |
|---|---|---|---|---|---|
| | | | 100 MHz | 1 GHz | 10 GHz |
| 23* | 0.7 | 1.5 | −0.07 | −0.85 | −1.62 |
| 24* | 0.6 | 1.3 | −0.06 | −0.68 | −1.20 |
| 25* | 0.5 | 1.0 | −0.05 | −0.56 | −1.02 |
| 26 | 0.4 | 0.8 | −0.05 | −0.35 | −0.90 |
| 27 | 0.3 | 0.6 | −0.03 | −0.20 | −0.65 |
| 28 | 0.2 | 0.4 | −0.02 | −0.19 | −0.50 |

A sample marked with an asterisk is beyond the scope of the invention.

It was found from Table 4 that the smoothness of the surface of the circuit pattern changed depending on light-transmittance in a wavelength of 355 nm, and wiring boards produced by the use of transfer sheets having organic resin films whose light-transmittance was more than 0.4 (sample Nos. 23 to 25) were inferior in high-frequency transmission characteristic and a transmission characteristic deteriorated to −1.0 dB or less in a high-frequency region of 10 GHz. On the contrary, wiring boards produced by the use of transfer sheets of the invention (sample Nos. 26 to 28) were excellent and a transmission characteristic was less than 1.0 dB even in a high-frequency region of 10 GHz.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A wiring board comprising:
   an insulation layer; and
   a conductor circuit, the conductor circuit being formed by transferring, from a transfer sheet including a base and a metal layer formed into a circuit pattern on the base and in which at least part of the circuit pattern is formed by laser-processing, the circuit pattern being transferred on a surface of the insulation layer,
   wherein a rim of the circuit pattern is formed by laser-processing, wherein the rim protrudes away from the base.

2. The wiring board of claim 1, wherein the insulation layer includes a liquid crystal polymer film, and organic resin adhesive layers which coat both surfaces of the liquid crystal polymer film opposed to each other.

3. A wiring board comprising:
   an insulation layer; and
   a conductor circuit, the conductor circuit being formed by transferring, from a transfer sheet including a base having light-transmittance in a wavelength of 150 to 400nm of 0.6 or more and a metal layer formed into a circuit pattern on the base and in which at least part of the circuit pattern is formed by laser-processing, the circuit pattern being transferred onto a surface of the insulation layer,
   wherein a rim of the circuit pattern is formed by laser-processing, wherein the rim protrudes away from the base.

4. The wiring board of claim 3, wherein the insulation layer includes a liquid crystal polymer film, and organic resin adhesive layers which coat both surfaces of the liquid crystal polymer film opposed to each other.

5. A wiring board comprising:

an insulation layer; and a resistor, the resistor being formed by transferring, from a transfer sheet including a base and a high-resistance metal layer of 20 $\mu\Omega$·cm or on the base and in which at least part of the resistor is formed by laser-processing, the resistor being transferred onto a surface of the insulation layer, wherein a rim of the resistor formed by laser-processing protrudes away from the base.

6. The wiring board of claim 5, wherein the insulation layer includes a liquid crystal polymer film, and organic resin adhesive layers which coat both surfaces of the liquid crystal polymer film opposed to each other.

* * * * *